United States Patent
Bayram et al.

(10) Patent No.: US 12,412,751 B2
(45) Date of Patent: Sep. 9, 2025

(54) LARGE AREA SYNTHESIS OF CUBIC PHASE GALLIUM NITRIDE ON SILICON

(71) Applicant: The Board of Trustees of the University of Illinois, Urbana, IL (US)

(72) Inventors: Can Bayram, Champaign, IL (US); Muhammad Ali Johar, Urbana, IL (US); Jae Kwon Lee, Champaign, IL (US)

(73) Assignee: The Board of Trustees of the University of Illinois, Urbana, IL (US)

(*) Notice: Subject to any disclaimer, the term of this patent is extended or adjusted under 35 U.S.C. 154(b) by 164 days.

(21) Appl. No.: 18/098,447

(22) Filed: Jan. 18, 2023

(65) Prior Publication Data
US 2023/0235480 A1 Jul. 27, 2023

Related U.S. Application Data

(60) Provisional application No. 63/301,766, filed on Jan. 21, 2022.

(51) Int. Cl.
*H10H 20/81* (2025.01)
*C30B 25/16* (2006.01)
(Continued)

(52) U.S. Cl.
CPC ........ *H01L 21/31111* (2013.01); *C30B 25/16* (2013.01); *C30B 25/183* (2013.01);
(Continued)

(58) Field of Classification Search
CPC .. H01S 5/026; H01S 5/34333; H01S 5/32341; H01S 5/32025; H10H 20/825; H10H 20/824; H10H 201/817
See application file for complete search history.

(56) References Cited

U.S. PATENT DOCUMENTS 7,879,147 B2    2/2011   Xu
8,313,967 B1 *  11/2012  Lee .................. H10D 62/10
                                           257/E21.127
(Continued)

FOREIGN PATENT DOCUMENTS

CN    110289206 A  *  9/2019 ....... H01L 21/02381
JP    4741506 B2       7/2007

OTHER PUBLICATIONS

Bayram et al., "Cubic Phase GaN Nano-grooved Si(100) via Maskless Selective Area Epitaxy", Advanced Functional Materials, vol. 24, pp. 4492-4496, 2014.
(Continued)

*Primary Examiner* — Ida M Soward
(74) *Attorney, Agent, or Firm* — Lowenstein Sandler LLP

(57) ABSTRACT

A wafer includes a buried substrate; a first layer of silicon (100) disposed on the buried substrate that includes silicon sidewalls (111) at an angle to the buried substrate and that form a bottom of each of multiple U-shaped grooves; a second layer of patterned oxide disposed on the silicon (100) that provides vertical sidewalls of each U-shaped groove formed within the first and second layers; a third layer of a buffer covering the first layer and partially covering the second layer partway up the vertical sidewalls; and multiple gallium nitride (GaN)-based structures disposed within the multiple U-shaped grooves, the multiple GaN-based structures each including cubic gallium nitride (c-GaN) formed at merged growth fronts of hexagonal gallium nitride (h-GaN) that extend from the silicon sidewalls (111).

13 Claims, 20 Drawing Sheets

(51) Int. Cl.
| | |
|---|---|
| C30B 25/18 | (2006.01) |
| C30B 29/40 | (2006.01) |
| H01L 21/02 | (2006.01) |
| H01L 21/311 | (2006.01) |
| H01L 21/3213 | (2006.01) |
| H10H 20/01 | (2025.01) |
| H10H 20/82 | (2025.01) |
| H01S 5/026 | (2006.01) |
| H01S 5/343 | (2006.01) |
| H10H 20/817 | (2025.01) |
| H10H 20/824 | (2025.01) |
| H10H 20/825 | (2025.01) |

(52) U.S. Cl.
CPC ........ *C30B 29/406* (2013.01); *H01L 21/0245* (2013.01); *H01L 21/02458* (2013.01); *H01L 21/02488* (2013.01); *H01L 21/02505* (2013.01); *H01L 21/0254* (2013.01); *H01L 21/02595* (2013.01); *H01L 21/02609* (2013.01); *H01L 21/0262* (2013.01); *H01L 21/32134* (2013.01); *H10H 20/01335* (2025.01); *H01L 21/02381* (2013.01); *H01S 5/026* (2013.01); *H01S 5/34333* (2013.01); *H01S 2304/04* (2013.01); *H10H 20/817* (2025.01); *H10H 20/824* (2025.01); *H10H 20/825* (2025.01)

(56) References Cited

U.S. PATENT DOCUMENTS

| | | | | |
|---|---|---|---|---|
| 8,823,142 | B2 | 9/2014 | Fujiwara | |
| 9,099,381 | B2* | 8/2015 | Bayram | ............ H01L 21/02639 |
| 9,608,160 | B1* | 3/2017 | Bayram | ............... H10H 20/825 |
| 10,027,086 | B2 | 7/2018 | Bayram | |
| 2010/0047947 | A1* | 2/2010 | Yashima | ................. H01S 5/227 |
| | | | | 438/40 |
| 2014/0131722 | A1* | 5/2014 | Bayram | ............ H01L 21/02639 |
| | | | | 438/478 |
| 2014/0131724 | A1* | 5/2014 | Bayram | ............ H01L 21/02658 |
| | | | | 257/76 |
| 2014/0134830 | A1* | 5/2014 | Bayram | ............. H10D 62/8503 |
| | | | | 438/478 |
| 2015/0079738 | A1* | 3/2015 | Barlow | ............. H10D 62/8503 |
| | | | | 438/172 |
| 2015/0108427 | A1* | 4/2015 | Brueck | ............ H01L 21/02587 |
| | | | | 257/14 |
| 2015/0206796 | A1* | 7/2015 | Dasgupta | ............. H10D 62/115 |
| | | | | 438/478 |
| 2017/0194476 | A1* | 7/2017 | Brueck | ............... H01L 21/0251 |
| 2017/0310076 | A1* | 10/2017 | Bayram | ............ H01L 21/02433 |
| 2021/0159338 | A1* | 5/2021 | Chang | ................. H10D 30/021 |

OTHER PUBLICATIONS

Caro et al., "Critical thickness of B-InN/GaN/Mgo structures", Journal of Applied Physics, vol. 107, 6 pages, 2010.
Delaney et al., "Auger recombination rates in nitrides from first principles", Applied Physics Letters, vol. 94, No. 19, 4 pages, May 2009.
Grady et al., "Simulation of zincblende AlGaN/GaN high electron mobility transistors for normally-off operation", Journal of Applied Physics, vol. 50, 8 pages, 2017.
Granzner et al., "Vertical design of cubic GaN-based high electron mobility transistors", Journal of Applied Physics, vol. 110, 8 pages, 2011.
Gundimeda et al., "Investigation of wurtzite formation in MOVPE-grown zincblende GaN epilayers on AlxGa1-xN nucleation layers", Journal of Applied Physics, vol. 131, 8 pages, 2022.
Han et al., "Bufferless 1.5 um III-V lasers grown on Si-photonics 220 nm silicon-on-insulator platforms", Optica, vol. 7, No. 2, p. 148-153, Feb. 2020.
Hernandez-Gutierrez et al., "Study of the heavily p-type doping of cubic GaN with Mg", Scientific Reports, No. 10, 7 pages, 2020.
Hilt et al., "Normally-off GaN Transistors for Power Applications", Journal of Physics: Conference Series, vol. 494, 7 pages, 2014.
Komiyama et al., "Suppression of crack generation in GaN epitaxy on Si using cubic SiC as intermediate layers", Applied Physics Letters, vol. 88, 4 pages, Mar. 2006.
Krustok et al., "Does the low-temperature Arrhenius plot of the photoluminescence intensity in CdTe point towards an erroneous activation energy?", Journal of Applied Physics, vol. 81, 5 pages, 1997.
Kuzmik, Jan, "Power Electronics on InAlN/(In)GaN: Prospect for a Record Performance", IEEE Electron Device Letters, vol. 22, No. 11, p. 510-512, Nov. 2001.
Lee et al., "Incorporation of indium on cubic GaN epitaxially induced on a nanofaceted Si(001) substrate by phase transition", Applied Physics Letters, vol. 107, 6 pages, 2015.
Lee et al., "Investigation of stacking faults in MOVPE-grown zincblende GaN by XRD and TEM", Journal of Applied Physics, vol. 125, 9 pages, 2019.
Liu et al., "Cathodoluminescence study of luminescence centers in hexagonal and cubic phase GaN hetero-integrated on Si(100)", Journal of Applied Physics, vol. 120, 7 pages, 2016.
Liu et al., "High Internal Quantum Efficiency Ultraviolet Emission from Phase-Transition Cubic GaN Integrated on Nanopatterned Si(100)", ACS Photonics, vol. 5, pp. 955-963, 2018.
Liu et al., "Maximizing cubic phase gallium nitride surface coverage on nano-patterned silicon (100)", Applied Physics Letters, vol. 109, 5 pages, 2016.
Machhandani et al., "Intersubband absorption of cubic GaN/Al(Ga)N quantum wells in the near-infrared to terahertz spectral range", American Physical Society, Physical Review B, No. 83, 5 pages, 2011.
McCarthy et al., "GaN HBT: Toward an RF Device", IEEE Transactions on Electron Devices, vol. 48, No. 3, p. 543-551, Mar. 2001.
Nakamura, et al., "Candela-class high-brightness InGaN/AlGaN double-heterostructure blue-light-emitting diodes", Applied Physics Letters, vol. 64, No. 13, p. 1687-1689, Mar. 28, 1994.
Simon et al., "Direct comparison of recombination dynamics in cubic and hexagonal GaN/AlN quantum dots", American Physical Society, Physical Review B, No. 68, 7 pages, 2003.
Tsai et al., "Band Alignments of Ternary Wurtzite and Zincblende III-Nitrides Investigated by Hybrid Density Functional Theory", ACS Omega, No. 5, pp. 3917-3923, 2020.
Tsai et al., "Interplay between Auger recombination, carrier leakage, and polarization in InGaAlN multiple-quantum-well light-emitting diodes", Journal of Applied Physics, vol. 131, 7 pages, 2022.
Tsai et al., "Quenching of the Efficiency Droop in Cubic Phase InGaAlN Light Emitting Diodes", IEEE Transactions on Electron Devices, vol. 69, No. 6, pp. 3240-3245, Jun. 6, 2022.
Vurgaftman et al., "Band parameters for nitrogen-containing semiconductors", Journal of Applied Physics, vol. 94, No. 6, p. 3675-3696, Sep. 15, 2003.
Wu, et al., "Photoluminescence properties of cubic GaN grown on GaAs(100) substrates by metalorganic vapor phase epitaxy", Applied Physics Letters, vol. 71, No. 15, p. 2067-2069, Oct. 13, 1997.
Yang et al., "Growth of cubic GaN on Si(001) by plasma-assisted MBE", Applied Surface Science, vol. 123-124, pp. 1-6, 1998.

* cited by examiner

6. III-Nitride Deposition (Wurtzitic Deposition Conditions - High Temperatures ~1100 - 1250C)

7. Completed III-Nitride Devices p: Period Opening
h: Deposition Height from Si(100) Surface
$t_d$: Depth of Etch

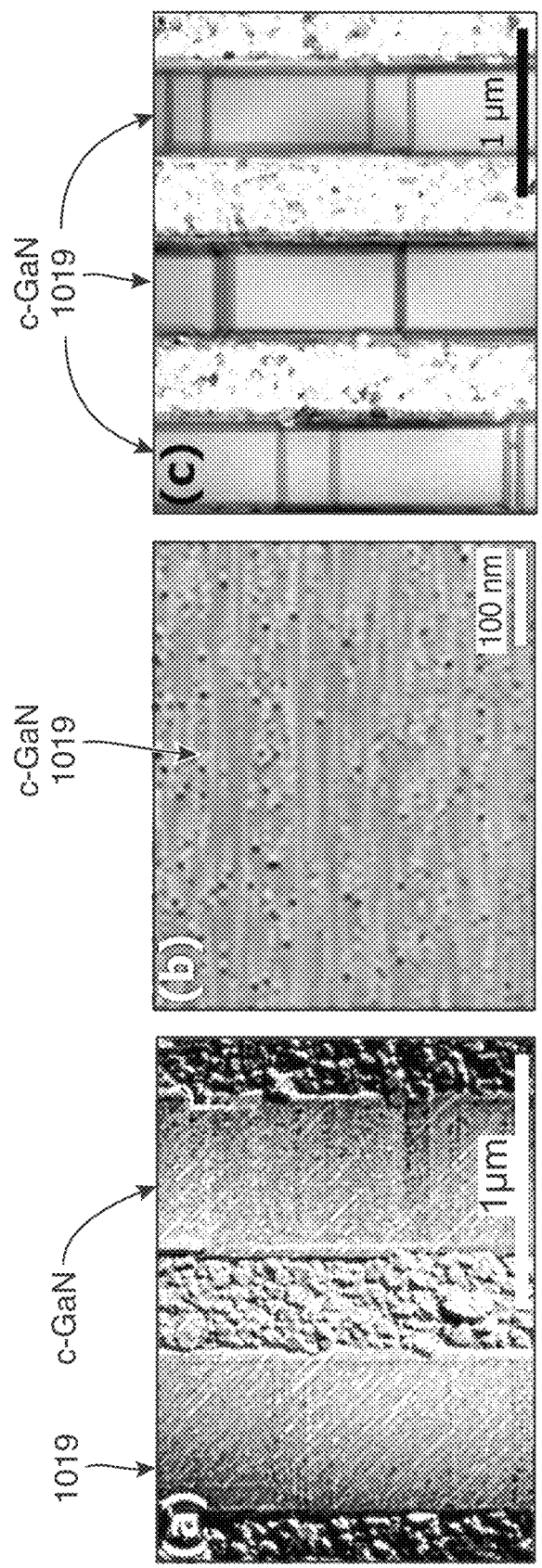

1700

LARGE AREA SYNTHESIS OF CUBIC PHASE GALLIUM NITRIDE ON SILICON

CLAIM OF PRIORITY

The present application claims the benefit under 35 U.S.C. § 119(e) of U.S. Provisional Patent Application No. 63/301,766 filed Jan. 21, 2022, which is incorporated by reference herein.

STATEMENT REGARDING FEDERALLY SPONSORED RESEARCH

This invention was made with government support under Award No. DE-AR0001109 awarded by the Advanced Research Projects Agency-Energy (ARPA-E) and under Grant no. NSF-ECCS-16-52871 awarded by the National Science Foundation. The government has certain rights in the invention.

BACKGROUND

The white light emitting diode (LED) has transformed the general lighting industry since its inception, providing a light source that is capable of an electrical luminescence efficacy of 150+ lumens/watt (lm/W), surpassing the most efficient conventional light source, which are sodium vapor lamps, with the added benefits of better color rendition, longer lifetime, robustness, compactness, and more advantages.

Today, the most efficient white LEDs are grown on a hexagonal-phase gallium nitride (h-GaN), which emits in the color blue, and a rare earth phosphor coating that down-converts some of the blue light to yellow, green, and/or red light. The issues with this approach are threefold. First, the down-conversion process is inherently inefficient as the photons lose some energy in the form of heat to convert to yellow and red photons. Second, rare earth phosphors are chemically unstable and add significant raw material and packaging cost (20%) to the device. Third, the blue LEDs suffer from efficiency droop, in which efficiency drops from greater than 75% under low power density operation (e.g., less than 10 ampere (A)/square centimeter ($cm^2$)) to less than 20% under high power density operation (e.g., greater than 100 A/$cm^2$).

With this inherent limitation of the semiconductor, h-GaN limits the exploitation of the LEDs. For example, to have more light output, more or larger LED chips are required to maintain an acceptable efficiency, and the cost correspondingly increases. These disadvantages of h-GaN-based semiconductors hinder the widespread adoption of LED for general lighting purposes as the upfront cost is often prohibitively high, which makes solid-state lighting (SSL) economically feasible only with the uncertain subsidies that are offered by the manufacturer or government.

Neither indium-gallium-nitride (InGaN) nor aluminum gallium indium phosphide (AlGaInP)-based LEDs have high efficiency in the green spectrum, creating the so-called "green gap." Eye sensitivity peaks in the green spectrum; thus, lack of use of green LEDs in white lighting generation impacts not only energy efficiency but also our health. LEDs in SSL applications operate under high current density where they generate more heat than light. This drop in efficiency with increasing current density is called "efficiency droop."

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 10A is an atomic force microscopy (AFM) image of a zoomed-in surface topography of defects of several c-GaN-grown strips according to an embodiment.

FIG. 10B is a further zoomed-in surface topography of a single c-GaN-grown strip according to an embodiment.

FIG. 10C is a plan-view transmission electron microscopy (plan-view TEM) image of a zoomed-in surface topology of several c-GaN strips according to an embodiment.

FIG. 13C is a flow chart of a third series of operations for removing LT-AlN and patterned oxide formed between the multiple c-GaN-grown strips according to at least one embodiment.

DETAILED DESCRIPTION

By way of introduction, the present disclosure seeks to resolve the above-discussed deficiencies in the current state of the art by efficiently providing blue-based, yellow-based, green-based, and red-based LEDs and associated devices by arranging the GaN atoms in a more symmetric and isotropic cubic phase (c-GaN) using semiconductor manufacturing technologies. In this highly-symmetric configuration, which eliminates the polarization fields that stems from the asymmetry in h-GaN, the positive carriers (holes) and negative carriers (electrons) can traverse through the semiconductor to the quantum well active regions with ease to produce photons even under high power density operation. The inherently smaller bandgap energy (e.g., 3.2 electron volts) of c-GaN allows c-GaN-grown strips to emit in the green part of the visible spectrum more efficiently than does h-GaN. The disclosed technology herein will detail processes by which c-GaN arrays can form large scale uniform patterns, which can be implemented to manufacturing affordable LEDs at scale.

Specifically, the disclosed solutions offer inexpensive and scalable engineered substrates for the solid-state lighting (SSL) and emerging radio frequency (RF) and power electronics, including GaN-based sub-micron transistors. The disclosed GaN-based devices may be integrated within GaN photonics using silicon electronics. Moreover, such GaN/Si technology offers excellent waveguides and enables GaN-on-Si (or GaN-on-SOI) photonics as a natural cleavage plane occurring for cubic phase GaN on Si (100). In this respect, the implications of the localized GaN-on-Si epitaxy results are diverse and very motivating for GaN—Si community, ranging from visible LEDs, laser diodes, and existing transistors.

The total addressable GaN substrate market was $4 billion in 2020 and should surpass $5.18 billion by 2023 with a healthy cumulative average growth rate of about 10% until 2027. The 4-inch substrate segment dominated in 2016 and was valued at $381.9 million alone. The market for 4-inch GaN wafers is expected rise because of its applications in power and RF devices and LEDs. Multiple various end users include automotive, healthcare, general lighting, consumer electronics, military communications, and optical storage. LED, laser, and power electronic devices, and RF are the major end users of GaN substrates and hold tremendous opportunity in near future. The GaN semiconductor device market is growing with a cumulative average growth rate of about 10% and will be approximately $25 billion by 2023. The major factors that are expected to drive the market are the vast addressable market for GaN in consumer electronics and automotive, wide bandgap property of GaN material encouraging innovative applications, success of GaN in RF power electronics, and increasing adoption of GaN RF semiconductor device in military, defense, and aerospace applications.

Figure 1A:
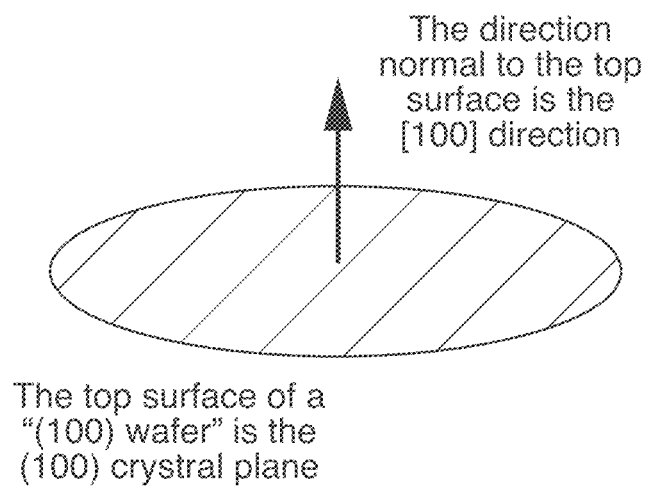
FIG. 1A is a simplified representation of a silicon layer (or wafer) having a crystal orientation in a (100) direction.

FIG. 1A is a simplified representation of a silicon layer (or wafer) having a crystal orientation in a (100) direction. A top surface of such a "(100) wafer" is the (100) crystal plane of silicon. Although the GaN-based strips are employed with reference to Si layers for purposes of epitaxial growth, the disclosed methods, components, and devices that employ the disclosed c-GaN layers can be built on a buried substrate that can vary in material. For example, the buried substrate can be composed of (e.g., comprising) at least one of silicon, a silicon-based oxide, or a dielectric, and can include silicon on insulator (SOD.

Figure 1B:
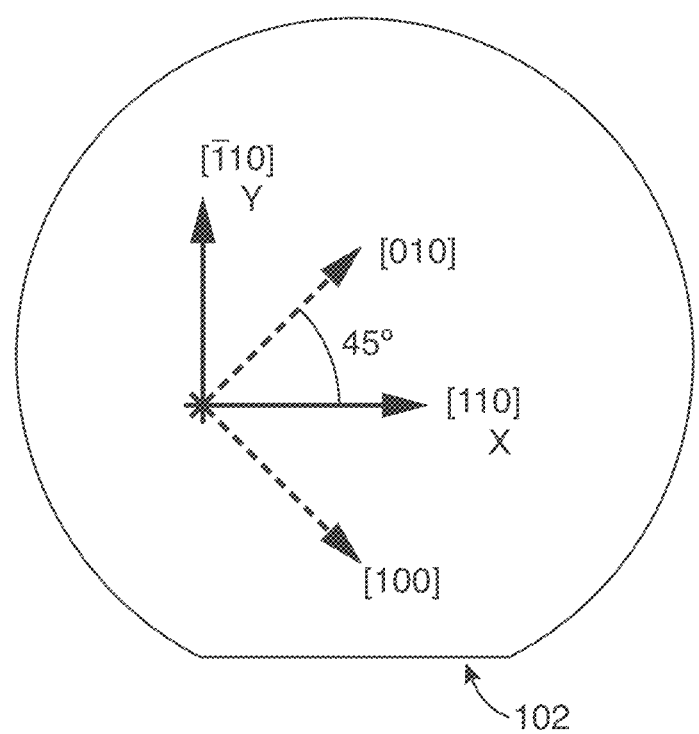
FIG. 1B is a top view of the silicon layer (or wafer) depicted in FIG. 1A illustrating semiconductor patterning directions and axes of the silicon crystal according to various embodiments.

FIG. 1B is a plane view of the silicon layer (or wafer) depicted in FIG. 1A illustrating semiconductor patterning directions and axes of the silicon crystal according to various embodiments. The disclosed patterns, which will be discussed in some detail, generally follow a specific direction. One aspect of the present disclosure is to form the exposed Si [111] facets on Si [100] substrates. The actual pattern lines are generally vertical to a wafer primary flat 102, which is the flat of the longest length located in the circumference of the wafer. The primary flat 102 has a specified crystal orientation relative to the wafer surface. An optional secondary flat (not shown) indicates the crystal orientation and doping of the wafer for patterning.

In this disclosure, according to at least some embodiments, the wafer primary flat is of the {110} direction family so the pattern lines (e.g., oxide lines or cubic GaN formation) is also of the {110} family with one direction reversed only. In one instance, if the wafer primary flat 102 is in [110] direction, the pattern lines can be formed in the [$\bar{1}$10] direction, as illustrated, or of course in the [1$\bar{1}$0] direction as these can be understood as being identical for the present processes.

Figure 2A:
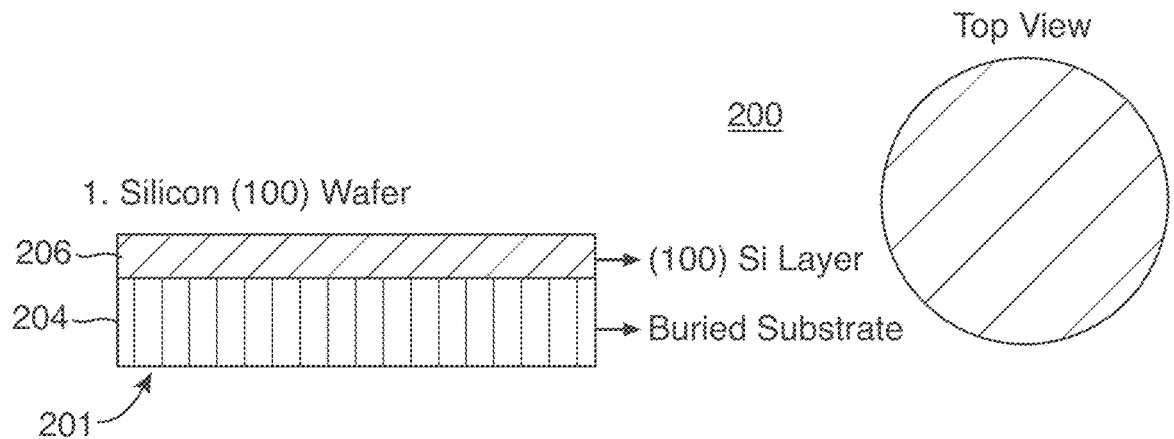
FIG. 2A, FIG. 2B, FIG. 2C, FIG. 2D, FIG. 2E, and FIG. 2F are processing step diagrams illustrating a method for manufacturing a Group III-nitride (e.g., gallium nitride (GaN)) device according to at least some embodiments.

FIG. 2A, FIG. 2B, FIG. 2C, FIG. 2D, FIG. 2E, and FIG. 2F are processing step diagrams illustrating a method for manufacturing a Group III-nitride (e.g., gallium nitride (GaN)) device according to at least some embodiments. As illustrated in FIG. 2A, the method 200 may begin with a substrate such as silicon (100) (Si), although other substrates (100) are also suitable as would be apparent to one skilled in the art. For example, as illustrated, a wafer 201 may include a buried substrate 204 and a silicon (Si) layer 206 disposed (e.g., deposited) on top of the buried substrate 204. In some embodiments, the buried substrate is silicon (Si), and thus the entire wafer, is a silicon wafer. In other embodiments, the buried substrate 204 is an insulator such as silicon-based oxide or a dielectric, thus generating a silicon-on-insulator (SOI) substrate. Other materials can be employed as the buried substrate 204 of the wafer 201, as would be apparent to those skilled in the art.

Figure 2B:
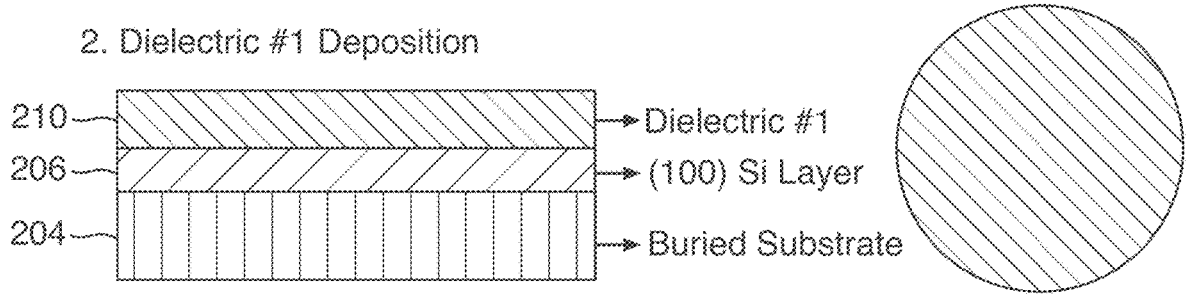
Figure 2C:
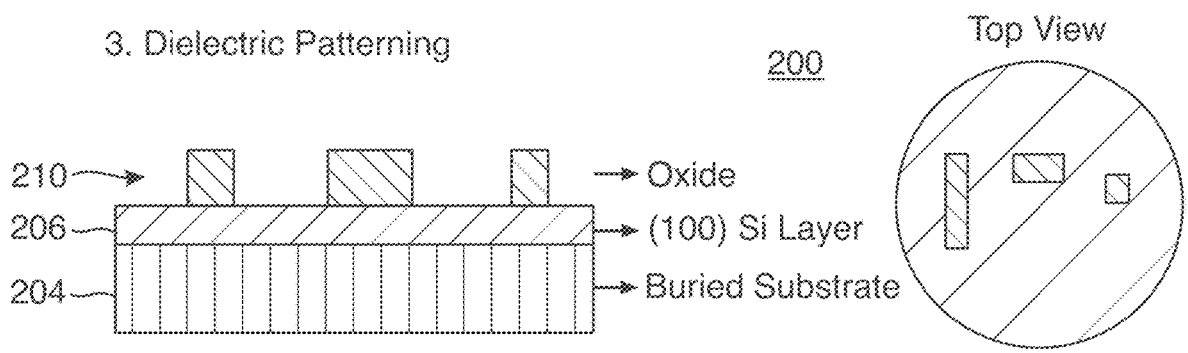

As illustrated in FIG. 2B, the method 200 may continue with disposing (e.g., depositing) an oxide layer 210 (such as silicon dioxide ($SiO_2$) or other suitable dielectric (such CMOS-compatible dielectrics, deposited at high temperatures with dry oxidation) on the Si layer 206. As illustrated in FIG. 2C, the method 200 may continue with patterning the oxide layer 210 to a desired shape, e.g., for location of U-shaped grooves, forming a part of a disclosed GaN-based device. Thus, the oxide layer 210 may also be referred to herein as the patterned oxide.

Figure 2D:
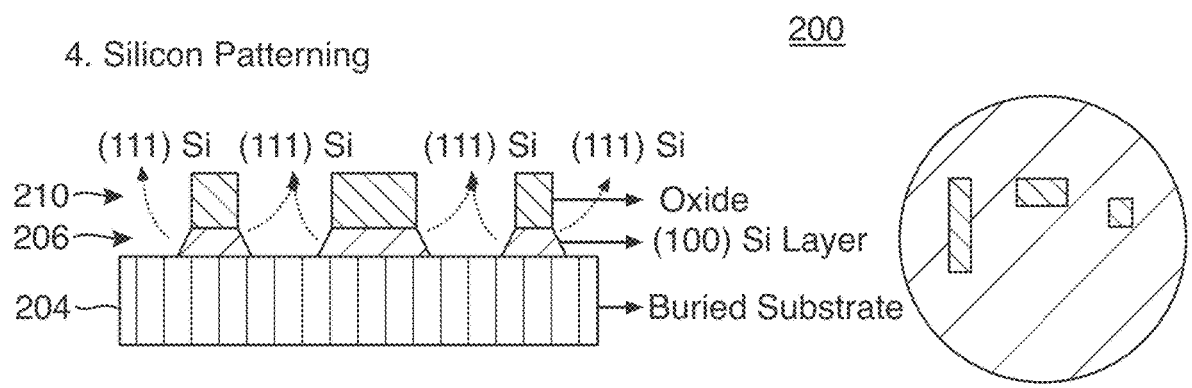

As illustrated in FIG. 2D, the method 200 may continue with etching the Si layer 126 exposed under the patterned oxide. The etching may occur preferentially in a way such as to create silicon sidewalls of the (111) direction holding up the patterned oxide layer, yet still retaining a bottom portion (100) of the buried substrate 204, thus defining a U-shaped groove. Such etching may be performed with potassium hydroxide (KOH), for example, which attacks the silicon sidewalls (111), until leaving the angled faces within the U-shaped grooves.

Figure 2E:
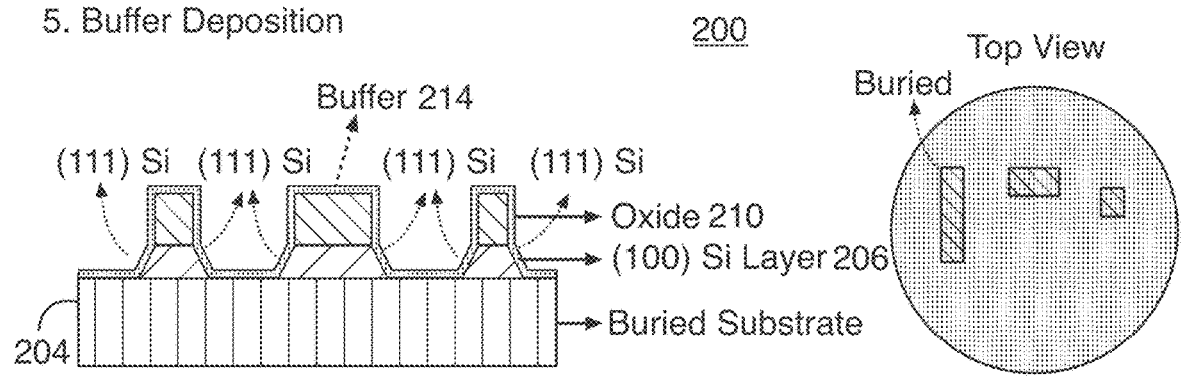

As illustrated in FIG. 2E, the method 200 may continue with deposition of a buffer 214 such as aluminum nitride (AlN) or aluminum nitride silicide (AlNSi) over the patterned dielectric and the etched, U-shaped grooves. The buffer 214 may, therefore, bury the patterned dielectric and provide a surface on which the Group III-nitride material, such as the disclosed h-GaN, may be grown.

Figure 2F:
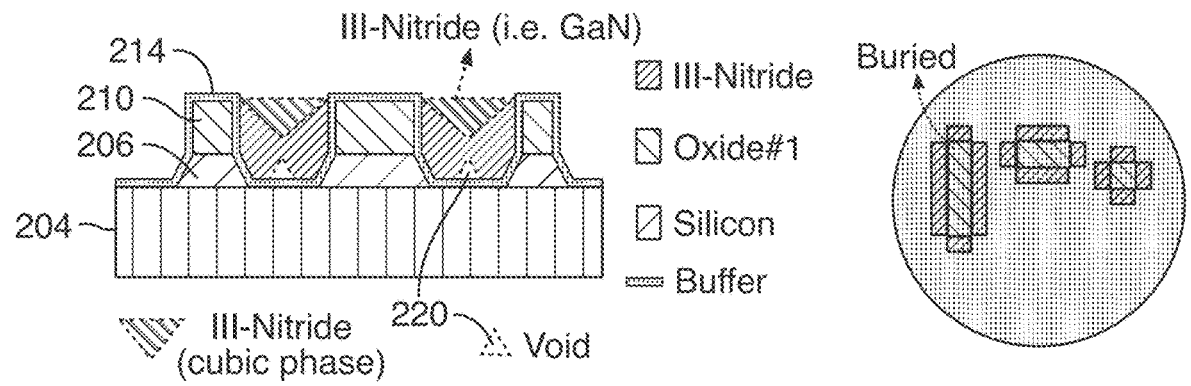

As illustrated in FIG. 2F, the method 200 may continue with deposition of the Group III-nitride material, e.g., h-GaN as provided by way of example herein, within the U-shaped grooves. The deposition of h-GaN can be performed via epitaxial growing of the h-GaN off of the silicon sidewalls (111) within the U-shaped grooves, and combines at merged growth fronts in the middle of the U-shaped grooves at about an angle of 109.5° (see FIG. 4). At the location of intersection or merging of these growth fronts, the h-GaN walls turn into cubic GaN (c-GaN), gradually building more c-GaN area as the h-GaN reduces and becomes buried and the c-GaN grows into triangle-shaped strips having a flat side along a surface of the wafer 201. The triangle-shaped strips may also generally include a void 220 formed below the intersection of the h-GaN growth fronts.

In some embodiments, accounting for dimensions, including Group III-nitride deposition thickness, allows the present method 200 to control the amount of c-GaN growth such that the c-GaN completely covers the h-GaN on which the c-GaN is grown. This allows for exposure of a non-polarized surface using inexpensive CMOS processing steps. As will be seen, undergrowth or overgrowth may occur when not knowing ahead of time the proper thickness of the deposited gallium nitride at which deposition should cease. This undergrowth or overgrowth may generally be unimportant due to the wet etching operations that follow to form the finalized substrates as will be explained in more detail.

Figure 3:
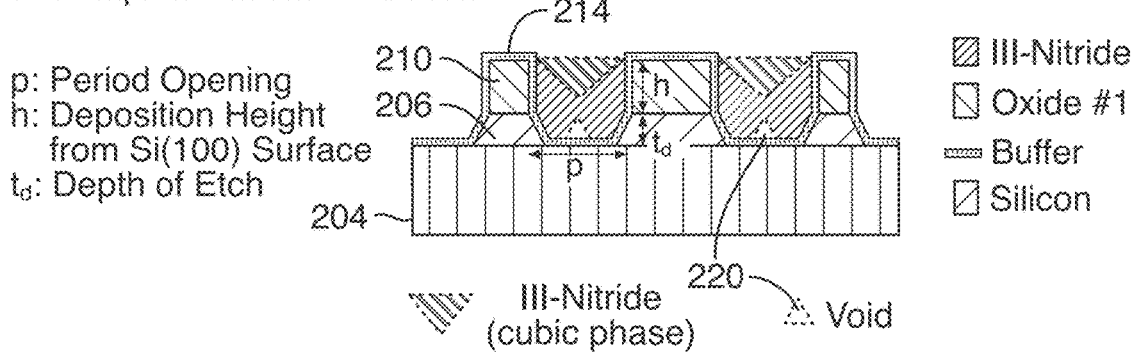
FIG. 3 is a cross-section view of a completed Group III-nitride device according to some embodiments.

FIG. 3 is a cross-section view of a completed Group III-nitride device 300 according to some embodiments. In some embodiments, the device 300 includes two U-shaped grooves, where one of the U-shaped grooves is marked with ideal dimensions, including a width or period (p) of the opening, an etch depth ($t_d$) of the silicon (100), and a disposition or growth thickness (h) of the Group III-nitride above the Si layer 206. Where the h-GaN merges off the silicon sidewalls (111) along the buffer portion on top of the buried substrate 204, the void 220 is formed that generally is shaped as a triangle.

Because these dimensions are controllable, the width of the opening of the U-shaped grooves and the etch depth may be known or approximated in advance. Accordingly, the deposition thickness (h) of the Group-III nitride (such as GaN) may be predetermined as being proportional to a difference between the width (p) of the opening of the U-shaped grooves and an etch depth ($t_d$) of the U-shaped grooves. With the deposition thickness (h) predetermined, the manufacturing process may be controlled to deposit only a certain amount of the Group III-nitride sufficient to reach about that thickness, h, although the thickness may vary more or less than h in the present embodiments due to the ability to wet etch afterwards.

Figure 4:
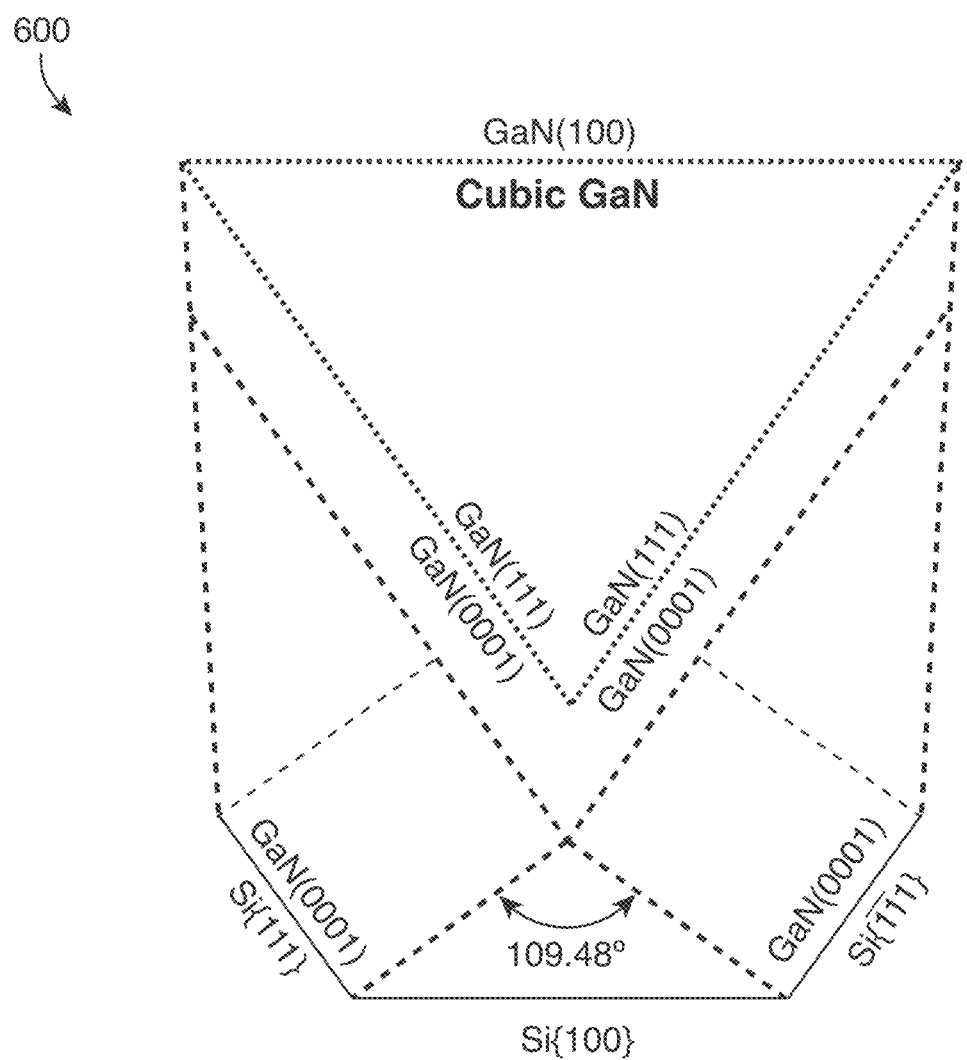
FIG. 4 is a diagram of a cross-section view of a GaN portion of a GaN device according to some embodiments.

FIG. 4 is a diagram of a cross-section view of a GaN portion of a GaN device according to some embodiments. In some embodiments, the phase transition between hexagonal gallium nitride (h-GaN) and cubic gallium nitride (c-GaN) occurs when the middle of the GaN(0001) or h-GaN growth fronts from the silicon sidewalls (111) merge. After a transition area, the c-GaN is grown upwards from these h-GaN growth fronts, illustrated as an inverted dotted triangle, gradually becoming bigger until completely covering the h-GaN growth happening below the inverted triangle. The crystal orientation at the different interfaces between the h-GaN underlying the c-GaN are likewise illustrated, e.g., where the GaN(0001) transitions to the GaN(111) along the bottom sides of the triangle-shaped c-GaN strips. The angle between lower h-GaN growth fronts can be formed at approximately 109.48°, by nature of the crystal orientation of the two h-GaN growth fronts meeting.

Figure 5:
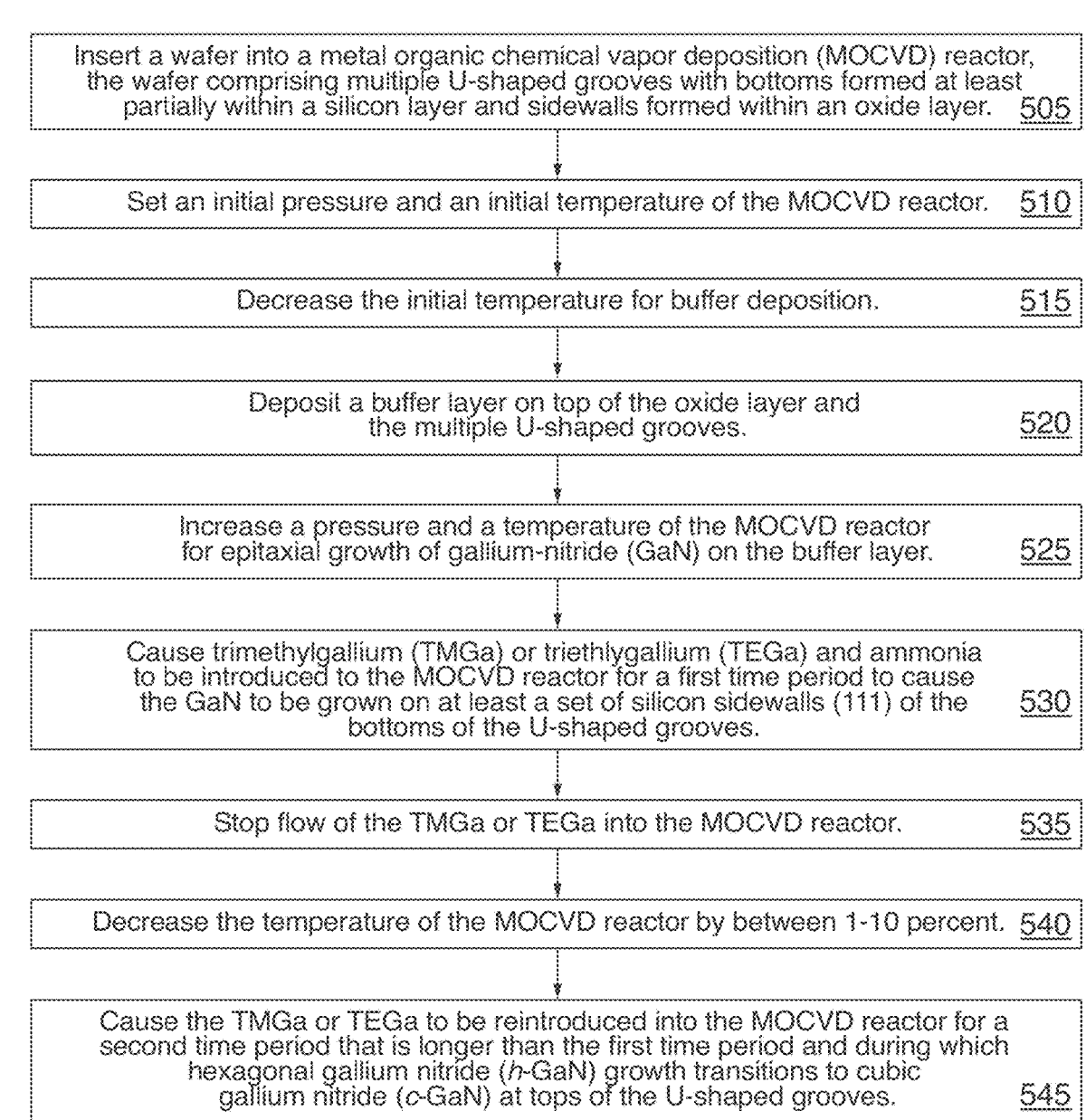
FIG. 5 is a flow chart of a method for large area synthesis fabrication of cubic GaN (c-GaN) on silicon according to some embodiments.

FIG. 5 is a flow chart of a method 500 for large area synthesis fabrication of cubic GaN (c-GaN) on silicon according to some embodiments. FIG. 6A, FIG. 6B, FIG. 6C, FIG. 6D, and FIG. 6E are a series of cross-section views of large area synthesis fabrication of c-GaN layers together with corresponding fabrication operations according to at least some embodiments. The method 500 can be performed using standard semiconductor deposition and etching techniques, e.g., in complementary metal-oxide-semiconductor (CMOS) processing technology, as will be explained. In some embodiments, therefore, at least some of the operations of the method 500 are controlled by a controller or processing device that interacts with the processing equipment, including with a metal organic chemical vapor deposition (MOCVD) reactor that is employed to perform epitaxial growth of h-GaN that forms the c-GaN in the disclosed substrates and devices.

Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

In at least some embodiments, the method 500 begins at operation 505 with inserting a wafer into the MOCVD reactor. The wafer includes multiple U-shaped grooves (see FIG. 6A and FIGS. 7A-7C) with bottoms formed at least partially within a silicon layer and sidewalls formed within an oxide layer. For example, the silicon layer can be the Si layer 206 and the silicon sidewalls are those silicon sidewalls (111) of FIGS. 2A-2F. The MOCVD reactor can provide means for epitaxial growth of the c-GaN.

Figures 6A, 6B, 6C, 6D, 6E:
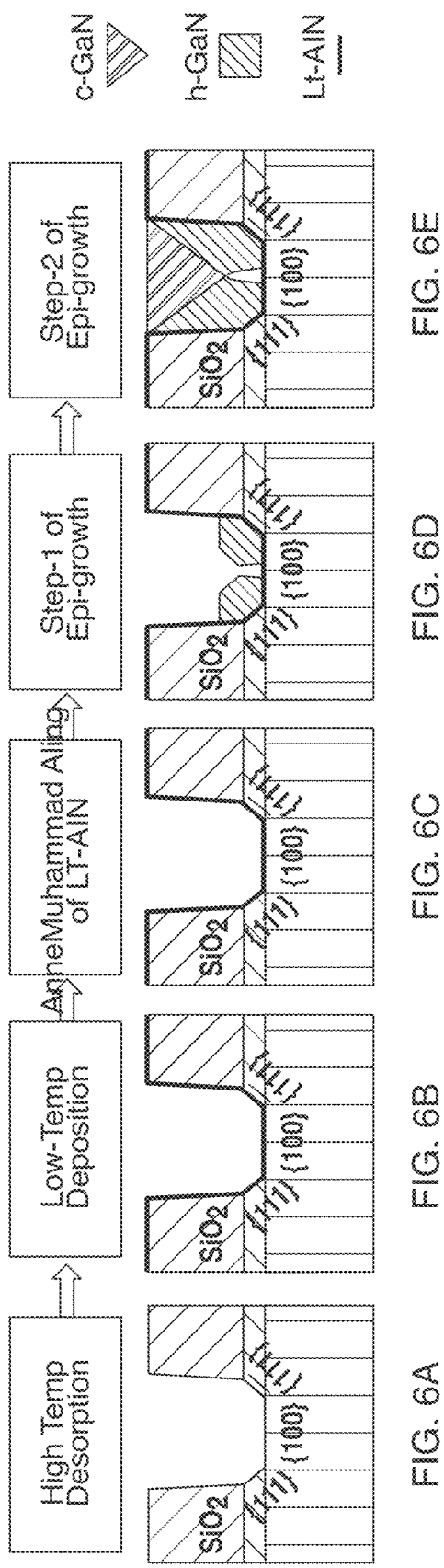
FIG. 6A, FIG. 6B, FIG. 6C, FIG. 6D, and FIG. 6E are a series of cross-section views of large area synthesis fabrication of c-GaN layers together with corresponding fabrication operations according to at least some embodiments.

At operation 510, the method 500 continues with optionally setting an initial pressure and an initial temperature of the MOCVD reactor if not already at target temperature and pressure levels for semiconductor processing. For example, the method 500 can include reducing a pressure of the MOCVD reactor to at least 50 millibar (mbar), increasing a temperature of the MOCVD reactor to at least 1000° C., and allowing a dwell time to pass of between 8-12 minutes, e.g., approximately 10 minutes. This operation may be referred to as high-temperature desorption as illustrated in FIG. 6A.

At operation 515, the method 500 continues with decreasing the initial temperature for buffer deposition, e.g., to between 900-1000° C. (e.g., 990° C.). At operation 520, the method 500 continues with depositing a buffer layer on top of the oxide layer and the multiple U-shaped grooves. For example, operation 520 can include pre-aluminization of the wafer for 20-35 seconds (e.g., 30 seconds) followed by the flow of ammonia ($NH_3$) into the MOCVD reactor to grow low-temperature (LT) aluminum nitride (AlN) film as the buffer layer. See "Low-Temp Deposition" in FIG. 6B, e.g., the TMAl is introduced at 7.5 standard cubic meters per minute (sccm) (or about 5.72 µmol/min$^{-1}$) and ammonia is introduced at 500 sccm (or about 22 mmol/min$^{-1}$) for between 35-40 minutes (e.g., about 37 minutes) at a pressure of 50 mbar.

At operation 525, the method 500 continues with increasing a pressure and a temperature of the MOCVD reactor for epitaxial growth of gallium-nitride (GaN) on the buffer layer, e.g., to an increased pressure and an increased temperature. Increasing the temperature of the MOCVD reactor for the epitaxial growth of the GaN and include increasing the temperature to between 1050-1150° C. (e.g., to 1090° C.). Increasing the pressure of the MOCVD reactor for the epitaxial growth of the GaN can include increasing the pressure to between 100-410 mbar (e.g., 400 mbar) for a short time of between 2-5 minutes (e.g., about 3 minutes or similar period of time). See "Annealing of LT-AlN" in FIG. 6C, e.g., causing the buffer layer to be annealed via exposure to the increased temperature.

At operation 530, the method 500 continues with causing trimethylgallium (TMGa) or triethylgallium (TEGa) and ammonia to be introduced to the MOCVD reactor for a first time period to cause the GaN to be grown on at least a set of silicon sidewalls (111) of the bottoms of the U-shaped grooves. In some embodiments, the first time period is between 3-7 minutes (e.g., about 5 minutes or other similar period of time). In some embodiments, the TMGa or TEGa is introduced at 10 sccm (or about 49.5 µmol/min-1) and the ammonia is introduced at 9000 sccm (e.g., about 401 mmol/min$^{-1}$) while at the 340-410 mbar pressure, within 15% of variation. This can be understood as step_1 of the epitaxial growth illustrated in FIG. 6D.

At operation 535, the method 500 continues with optionally stopping flow of the TMGa or TEGa into the MOCVD reactor. At operation 540, the method 500 continues with optionally decreasing the temperature of the MOCVD reactor by between approximately 1-10 percent, e.g., to 1010° C., 1030° C., or 1050° C. in different embodiments. In some embodiments, operations 535 and 540 can be considered a pause in growing the GaN in operation 530, and can involve different adjustments to the pressure and/or temperature of the MOCVD reactor to prepare the MOCVD reactor for optimum c-GaN growth. In other embodiments, the pause involves stopping flow of the TMGa or TEGa into the MOCVD reactor without adjustments to the temperature and pressure if the latter are already sufficiently or substantially optimum.

At operation 545, the method 500 continues with causing the TMGa to be reintroduced into the MOCVD reactor for a second time period that is longer than the first time period and during which hexagonal gallium nitride (h-GaN) growth transitions to cubic gallium nitride (c-GaN) at tops of the U-shaped grooves. In one embodiment, the second time period is between 25-40 minutes (e.g., 30 minutes). In these embodiments, TMGa or TEGa continues to be introduced at 10 sccm (49.5 µmol/min-1) and the ammonia introduced at 9000 sccm (401 mmol/min$^{-1}$) while at the 340-410 mbar pressure, for example, within 15% of variation. This can be understood as Step-2 of the epitaxial growth illustrated in FIG. 6E.

In various embodiments, operations 505 through 545 can make the h-GaN oxidized by the oxide layer, making the h-GaN wet-etchable. The wet-etchability of the h-GaN will be exploited later on in this disclosure to modify these grown structures for performance due to clean symmetry of the c-GaN structures. After the growth of c-GaN, the top coverage of c-GaN seems dependent on the geometry of U-shaped groove, however, it is possible to get a 100% c-GaN top surface without following the etch depth and other parameters of the U-shaped groove very accurately.

Figure 7A:
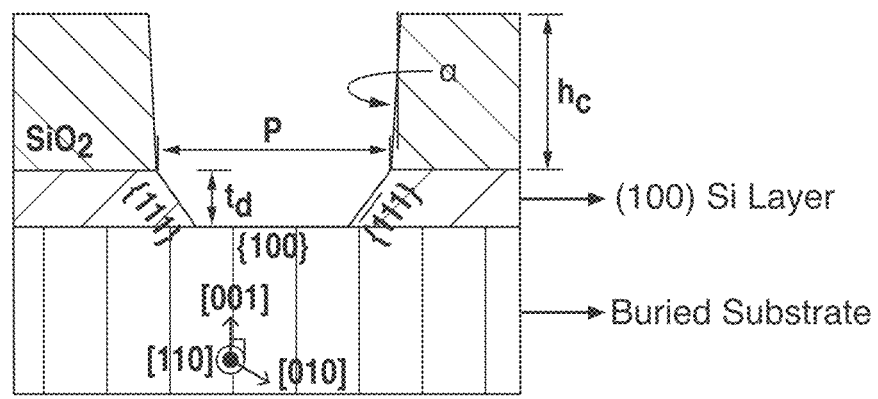
FIG. 7A is a cross-section view of a U-shaped groove etched into a silicon layer and having sidewalls formed from patterned oxide according to at least one embodiment.

FIG. 7A is a cross-section view of a U-shaped groove etched into a silicon layer and having sidewalls formed from patterned oxide according to at least one embodiment. The structure of the U-shaped groove is marked with similar dimensions as illustrated with reference to FIG. 3, where $h_c$ is the critical GaN deposition thickness (defined as the GaN deposition height above Si layer (100) that maximizes cubic phase GaN coverage on the U-groove surface), $t_d$ is the etch depth, p is the opening width, and a is the oxide sidewall angle. As illustrated, in at least one embodiment, one of the silicon sidewalls has an orientation of {111} (where the "{" bracket indicates a family of planes) and another of the silicon sidewalls has an orientation of {$\overline{1}\overline{1}1$}. Further, the orientation of coordinate sides of the buried substrate is illustrated by way of example.

Figure 7B:
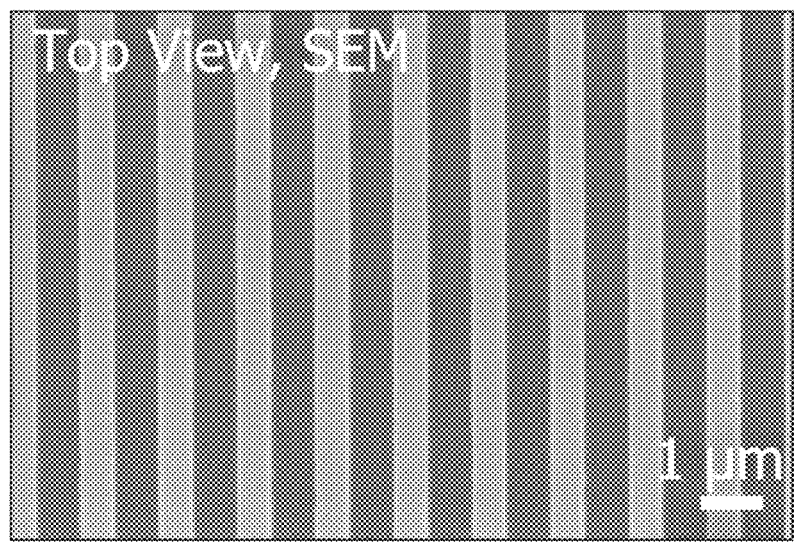
FIG. 7B is a scanning electron microscope (SEM) image of a top view of multiple parallel-oriented U-shaped grooves such as the U-shaped groove of FIG. 7A according to at least some embodiment.
Figure 7C:
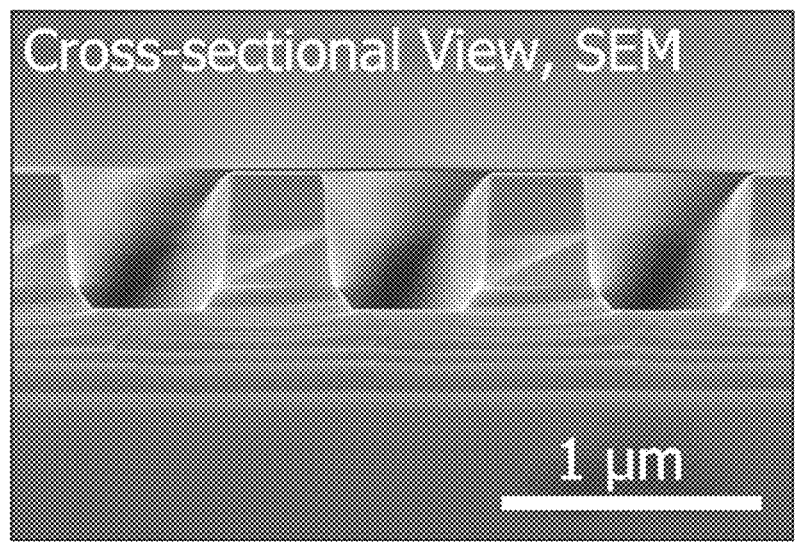
FIG. 7C is a SEM image of a cross-section view of several of the multiple U-shaped grooves illustrated in FIG. 7B according to at least one embodiment.

FIG. 7B is a scanning electron microscope (SEM) image of a top view of multiple parallel-oriented U-shaped grooves such as the U-shaped groove of FIG. 7A according to at least some embodiments. FIG. 7C is a SEM image of a cross-section view of several of the multiple U-shaped grooves illustrated in FIG. 7B according to at least one embodiment.

Figure 8A:
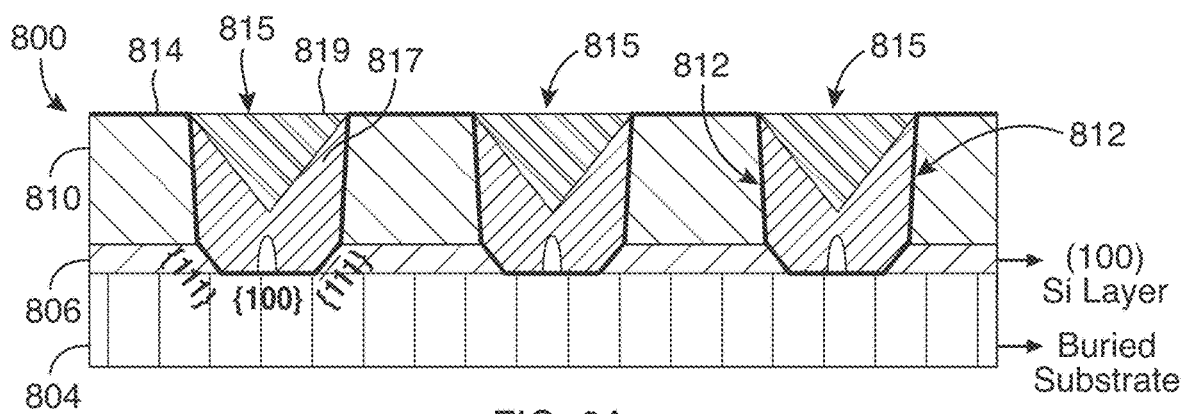
FIG. 8A is a cross-section view of a wafer having several GaN-based strips epitaxially grown (as in FIGS. 6D-6E) within the U-shaped grooves according to at least one embodiment.

FIG. 8A is a cross-section view of a wafer 800 having several GaN-based strips 815 epitaxially grown (as in FIGS. 6D-6E) within the U-shaped grooves according to at least one embodiment. In at least some embodiments, the wafer 800 includes a buried substrate 804 and a first layer of silicon (100) 806 disposed on the buried substrate. The first layer of silicon 806 may include silicon sidewalls (111) at an angle to the buried substrate 804 that form a bottom of each of multiple U-shaped grooves. A second layer of patterned oxide 810 is disposed on the silicon (100) that provide vertical sidewalls 812 of each U-shaped groove and which are formed within the first and second layers of the wafer 800. A third layer of a buffer 814 covers the buried substrate 804, the silicon sidewalls (111) of the first layer and the second layer, including within the U-shape groves. Multiple gallium nitride (GaN)-based structures 815 are disposed on the third layer within the multiple U-shaped grooves, the multiple GaN-based structures 815 each including cubic gallium nitride (c-GaN) material 819 formed at merged growth fronts of hexagonal gallium nitride (h-GaN) material 817 that extend from the silicon sidewalls ($\overline{1}\overline{1}1$). In some embodiments, this c-GaN material 819 are c-GaN-grown strips 819.

In these embodiments, the buried substrate 804 is one of silicon, a silicon-based oxide, or a dielectric, the patterned oxide 810 includes one of silicon dioxide or silicon nitride oxide, and the buffer 814 includes one of aluminum nitride and aluminum silicide. In at least some embodiments, an upper layer of the c-GaN (e.g., c-GaN-grown strips 819) is parallel to the first layer, is substantially free of threading dislocations, and includes one or more stacking faults. In some embodiments, a facet density of the c-GaN 819 is between approximately $3\text{-}4\times10^4$ per centimeter. In disclosed embodiments, the facet density refers to a density of atomic-layer transitions within the same material, here specifically the c-GaN layer of strips.

Figure 8B:
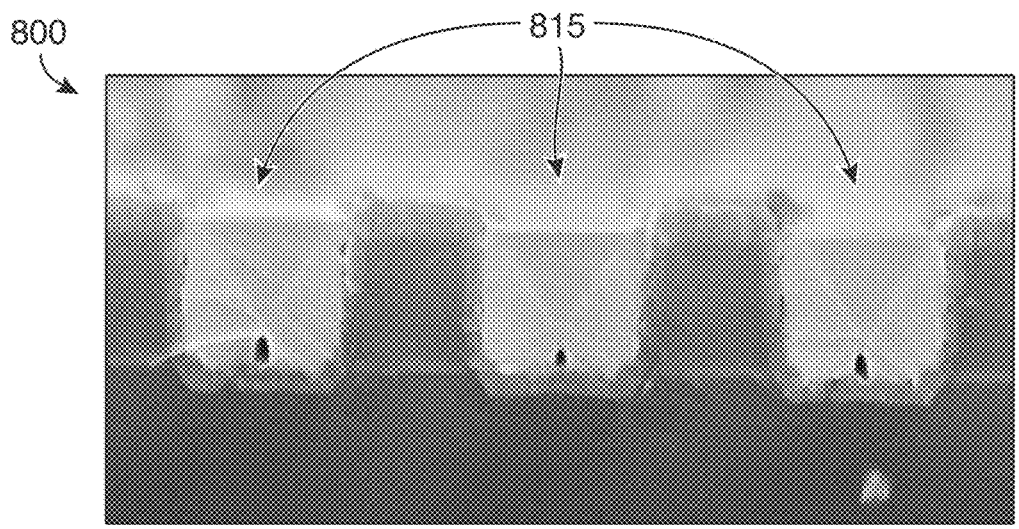
FIG. 8B is an SEM image of a cross-section view of the wafer of FIG. 8A according to at least one embodiment.
Figure 8C:
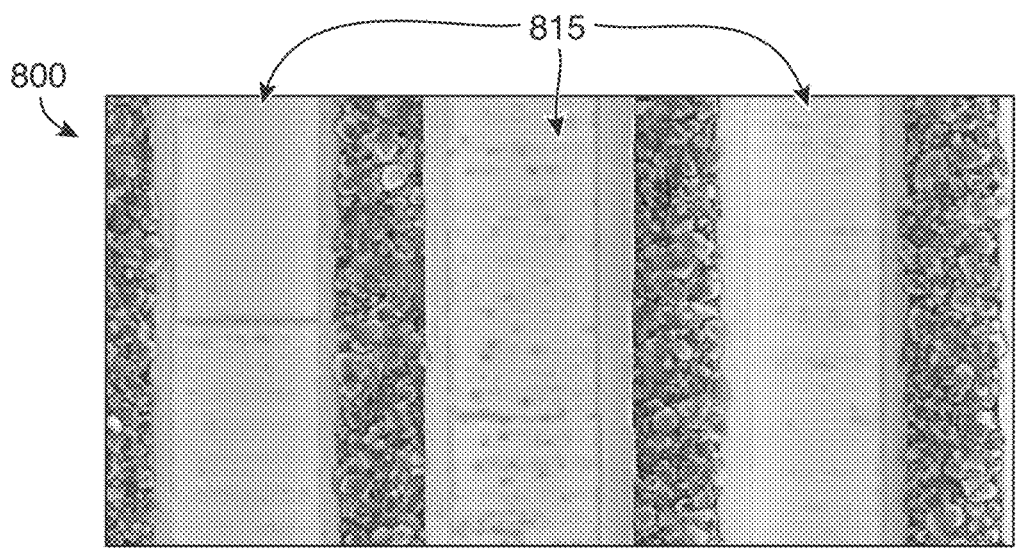
FIG. 8C is an SEM image of a top view of the wafer of FIG. 8A according to at least one embodiment.

FIG. 8B is an SEM image of a cross-section view of the wafer 800 of FIG. 8A according to at least one embodiment illustrating the GaN-based structures 815. FIG. 8C is an SEM image of a top view of the wafer 800 of FIG. 8A according to at least one embodiment, illustrating the GaN-based structures 815.

Figure 9A:
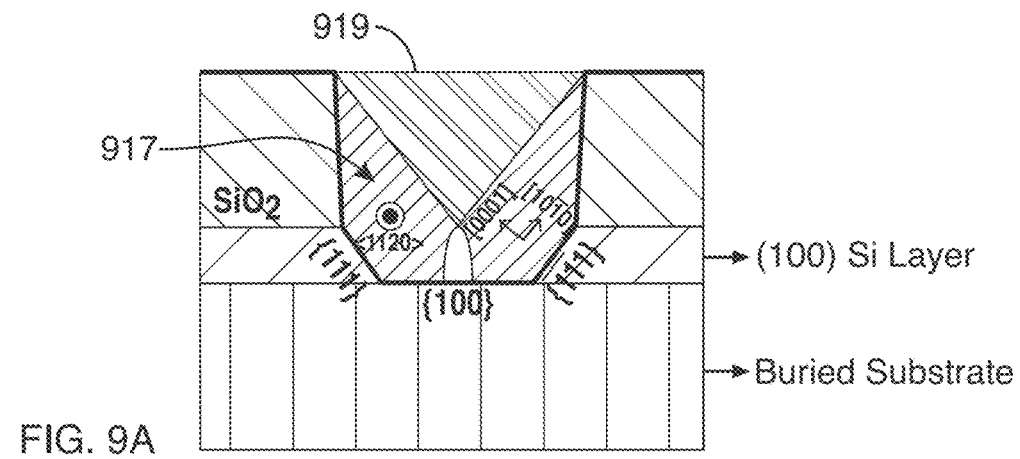
FIG. 9A is a cross-section view of a c-GaN strip grown within a U-shaped groove and illustrating directionality of an underlying h-GaN strip and Si-based interfaces according to at least one embodiment.
Figure 9B:
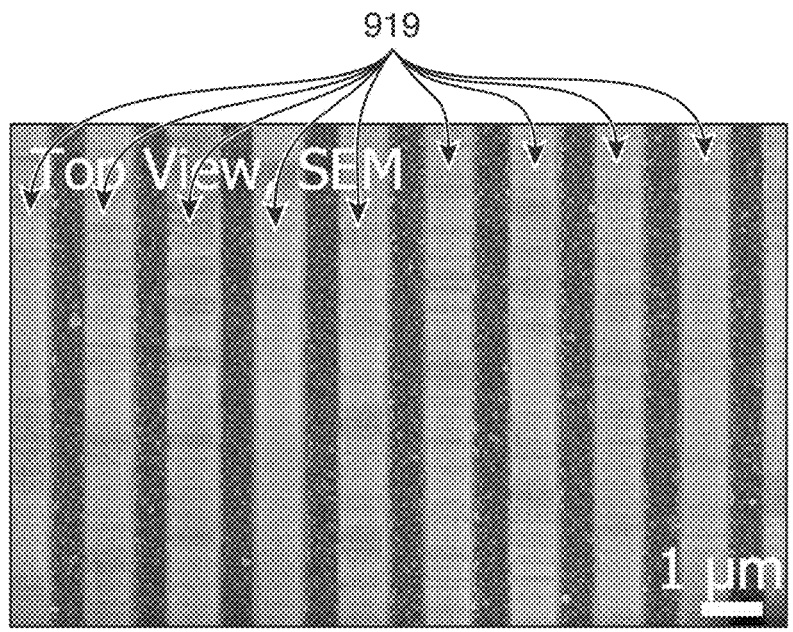
FIG. 9B is an SEM image of a top view of multiple c-GaN-grown strips with U-shaped grooves such as illustrated in FIG. 9A according to at least one embodiment.
Figure 9C:
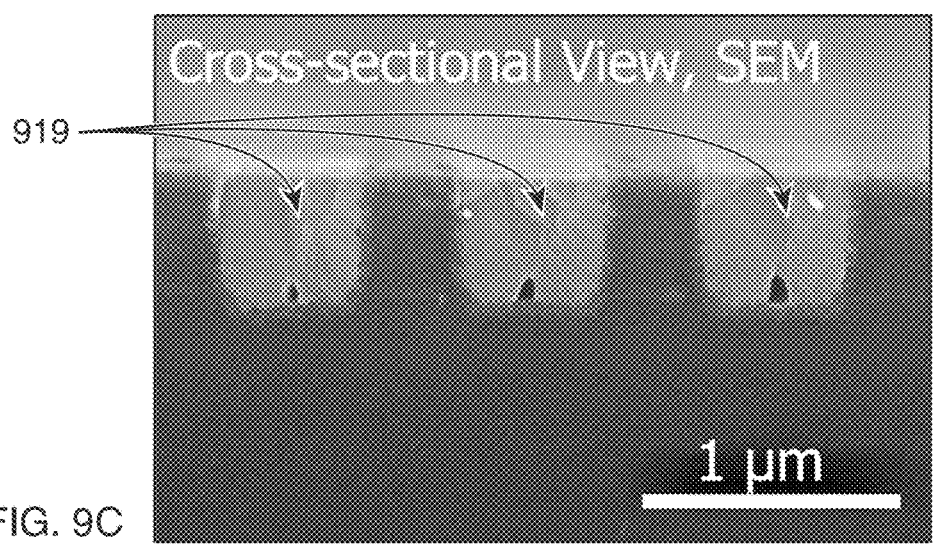
FIG. 9C is an SEM image of a cross-section of several of the multiple c-GaN-grown strips within U-shaped grooves such as illustrated in FIG. 9A according to at least one embodiment.

FIG. 9A is a cross-section view of a c-GaN strip 919 grown within a U-shaped groove and illustrating directionality of an underlying h-GaN strip 917 and Si-based interfaces according to at least one embodiment. For example, the h-GaN strip 917 is oriented in a [0001] by [1010] direction along a <1120> direction (into the page). The silicon sidewalls of the U-shaped groove are oriented in a family plane of {111} and {$\overline{1}\overline{1}1$} from left to right, respectively, while a bottom of the U-shaped grooves is oriented in a silicon plane of {100}, as was discussed previously. While the Si layer (100) is illustrated separated from the buried substrate, as discussed previously, these two layers can be combined as a unified Si substrate in some embodiments. FIG. 9B is an SEM image of a top view of multiple c-GaN-grown strips 919 with U-shaped grooves such as illustrated in FIG. 9A according to at least one embodiment. FIG. 9C is an SEM image of a cross-section of several of the multiple grown c-GaN-grown strips 919 within U-shaped grooves such as illustrated in FIG. 9A according to at least one embodiment.

FIG. 10A is an atomic force microscopy (AFM) image of a zoomed-in surface topography of defects of several etched c-GaN-grown strips 1019 according to an embodiment. FIG. 10B is a further zoomed-in surface topography of a single c-GaN-grown strip 1019 according to an embodiment. FIG. 10C is a plan-view transmission electron microscopy (plan-view TEM) image of a zoomed-in surface topology of several c-GaN-grown strips 1019 according to an embodiment. In some experimental results, the facet density went from $>10^8$ per cm for c-GaN grown on 3C—SiC to $<10^5$ per cm if grown on as in the present disclosure on a Si layer, including a buried substrate, as described. This is three orders, at $10^5$, of improvement compared to the previous $10^8$ if on 3C—SiC.

Figure 11A:
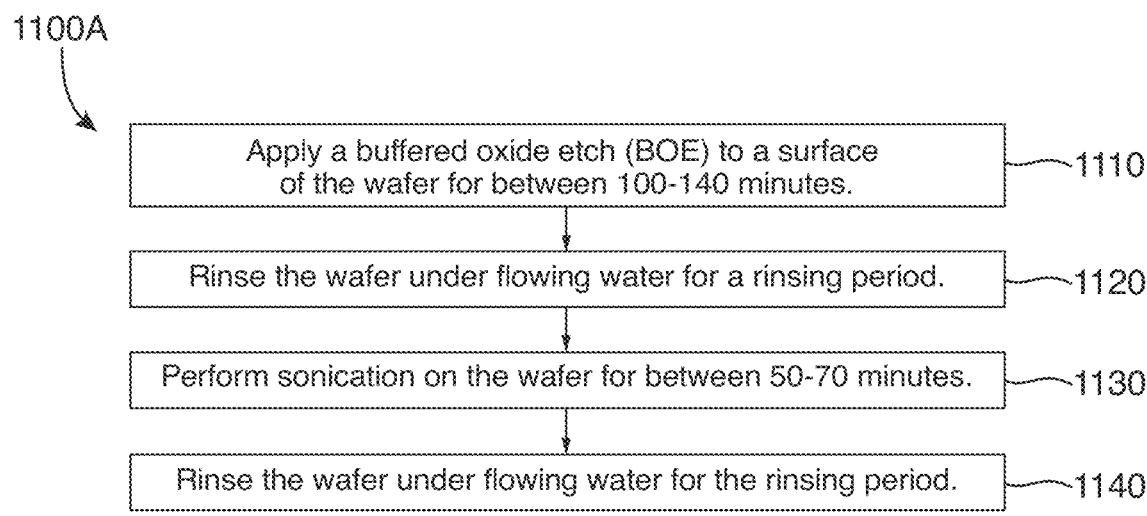
FIG. 11A is a flow chart of a first series of operations for removing low-temperature, aluminum nitride (LT-AlN) from the c-GaN-grown strips according at least one embodiment.

FIG. 11A is a flow chart of a first series of operations 1100A for removing low-temperature, aluminum nitride (LT-AlN) from the c-GaN-grown strips according at least one embodiment. The operations 1100A can be performed using standard semiconductor deposition and etching techniques, e.g., in complementary metal-oxide-semiconductor (CMOS) processing technology, as will be explained. In some embodiments, therefore, at least some of the operations 1100A are controlled by a controller or processing device that interacts with CMOS processing equipment.

The operations 1100A may begin with a wafer having multiple U-shaped grooves in which are grown gallium-nitride (GaN)-based structures, the multiple U-shaped grooves including a patterned oxide layer and a buffer layer disposed on the patterned oxide layer. The operations 1100A may designed to perform a wet etch of the wafer to partially remove the buffer layer. In some embodiments, performing the wet etch causes the buffer layer to be removed from a patterned oxide layer disposed between the U-shaped grooves and at least partially from within a top portion of the U-shaped grooves (see FIG. 12A).

At operation 1110, the processing equipment applies a buffered oxide etch (BOE) to a surface of the wafer for between 45-85 seconds, e.g., 60 seconds in one embodiment.

At operation 1120, the processing equipment rinses the wafer under flowing water for a rinsing period. In some embodiments, the rising period is between 30 seconds and two minutes, e.g., 1 minute in one embodiment.

At operation 1130, the processing equipment performs sonication on the wafer for between 100-140 minutes, e.g., two hours.

At operation 1140, the processing equipment rinses the wafer under flowing water for the rinsing period.

Figure 11B:
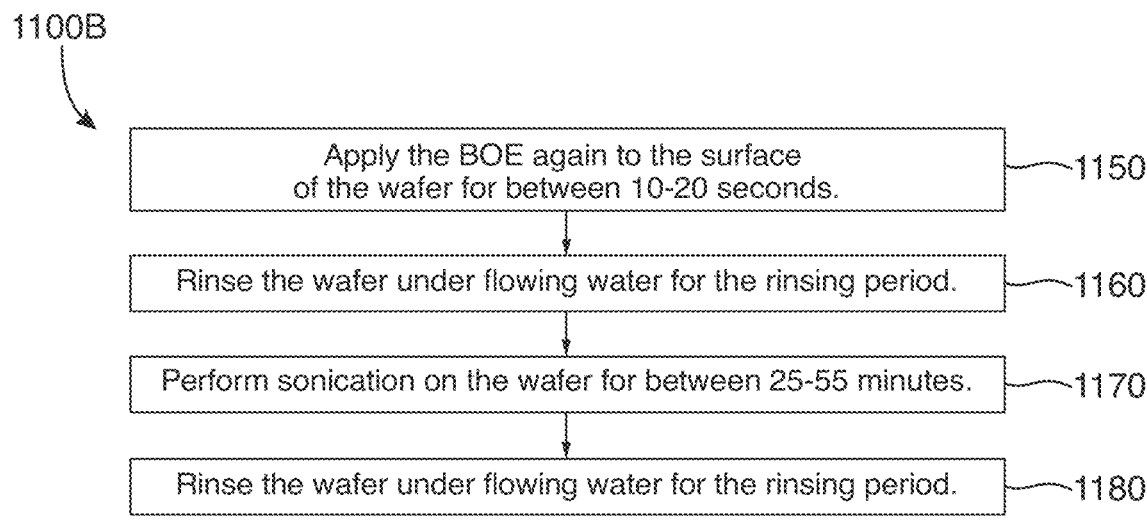
FIG. 11B is a flow chart of a second series of operations from removing the LT-AlN from the c-GaN-grown strips according to at least one embodiment.

FIG. 11B is a flow chart of a second series of operations 1100B from removing the LT-AlN from the c-GaN-grown strips according to at least one embodiment. The operations 1100B can be performed using standard semiconductor deposition and etching techniques, e.g., in complementary metal-oxide-semiconductor (CMOS) processing technology, as will be explained. In some embodiments, therefore, at least some of the operations 1100B are controlled by a controller or processing device that interacts with CMOS processing equipment.

At operation 1150, the processing equipment again applies the BOE to the surface of the wafer for between 10-20 seconds, e.g., 15 seconds in one embodiment.

At operation 1160, the processing equipment rinsing the wafer under flowing water for the rinsing period.

At operation 1170, the processing equipment performs sonication on the wafer for between 25-55 minutes, e.g., 45 minutes in one embodiment.

At operation 1180, the processing equipment rinses the wafer under flowing water for the rinsing period.

Figure 12A:
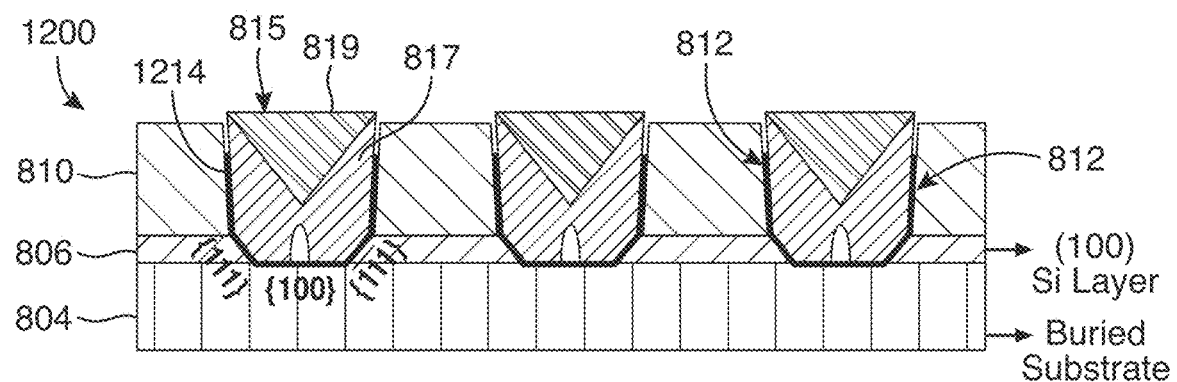
FIG. 12A is a cross-section view of a wafer having c-GaN-grown strips after the LT-AlN has been at least partially removed according to at least one embodiment.

FIG. 12A is a cross-section view of a wafer 1200 having c-GaN-grown strips 819 after the LT-AlN has been at least partially removed according to at least one embodiment. In at least some embodiments, the wafer 1200 includes a buried substrate 804 and a first layer of silicon (100) 806 disposed on the buried substrate that includes silicon sidewalls (111) at an angle to the buried substrate 804 and that form a bottom of each of multiple U-shaped grooves. A second layer of patterned oxide 810 is disposed on the silicon (100) that provide vertical sidewalls 812 of each U-shaped groove and which are formed within the first and second layers. In this embodiment, a third layer of a buffer 1214 covers the silicon sidewalls (111) of the first layer and the buried substrate 804 within the U-shaped grooves and partially covers the second layer partway up the vertical sidewalls. In these embodiments, the third layer of the buffer 1214 has been etched from the top of the patterned oxide 810 as per the method 1100 of FIG. 11, such that buffer layer is at least partially etched down the vertical sidewalls 812 of the U-shaped grooves.

With continued reference to FIG. 12A, in at least some embodiments, multiple gallium nitride (GaN)-based structures 815 are disposed within the multiple U-shaped grooves, the multiple GaN-based structures 815 each including cubic gallium nitride (c-GaN) 819 formed at merged growth fronts of hexagonal gallium nitride (h-GaN) 817 that extend from the silicon sidewalls (111). In some embodiments, this c-GaN 819 are c-GaN-grown strips 819, as illustrated. In some embodiments, a facet density of the c-GaN is between approximately $3\text{-}4 \times 10^4$ per centimeter.

Figure 12B:
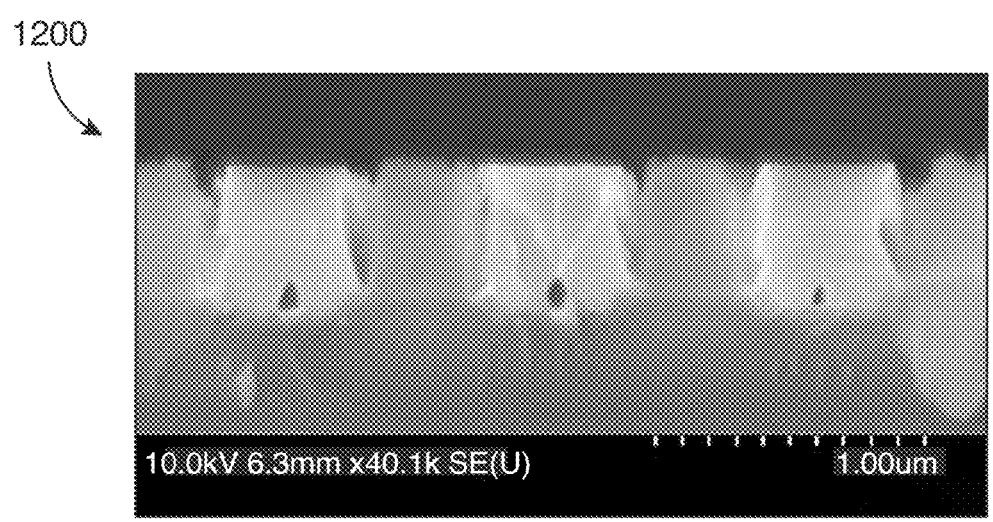
FIG. 12B is an SEM image of a cross-section view of the wafer of FIG. 12A according to at least one embodiment.
Figure 12C:
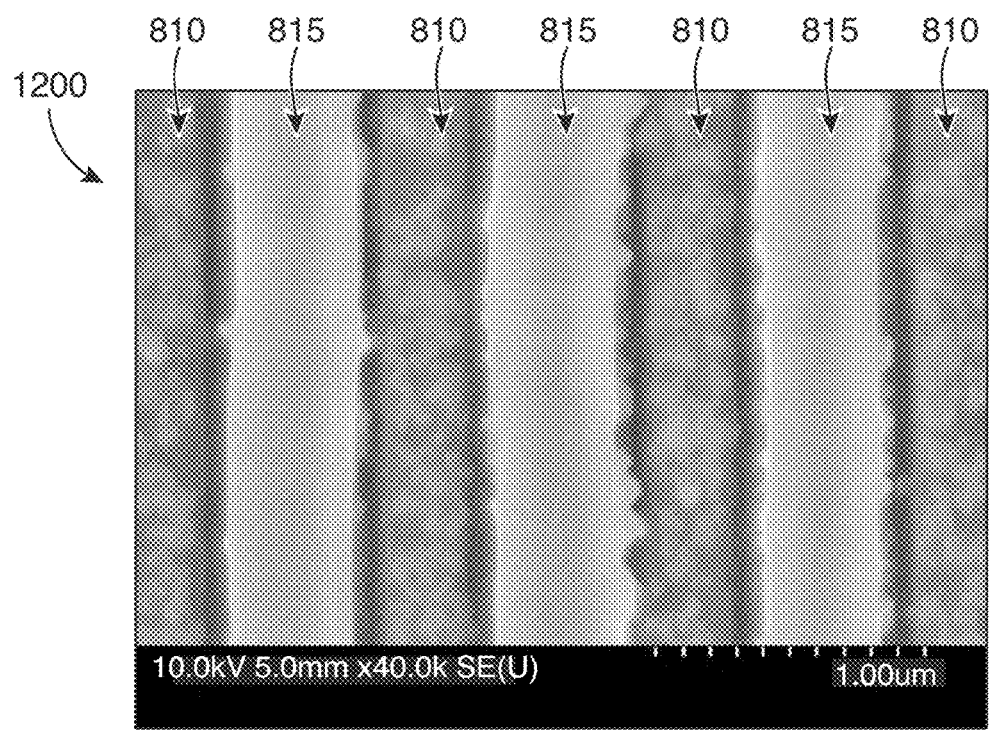
FIG. 12C is an SEM image of a top view of the wafer of FIG. 12A according to at least one embodiment.

FIG. 12B is an SEM image of a cross-section view of the wafer 1200 of FIG. 12A according to at least one embodiment. FIG. 12C is an SEM image of a top view of the wafer 1200 of FIG. 12A according to at least one embodiment. In FIGS. 12B-12C, the GaN-based structures 815 are strips with the patterned oxide 810 illustrated as being exposed, via etching, between the GaN-based structures 815.

Figure 13A:
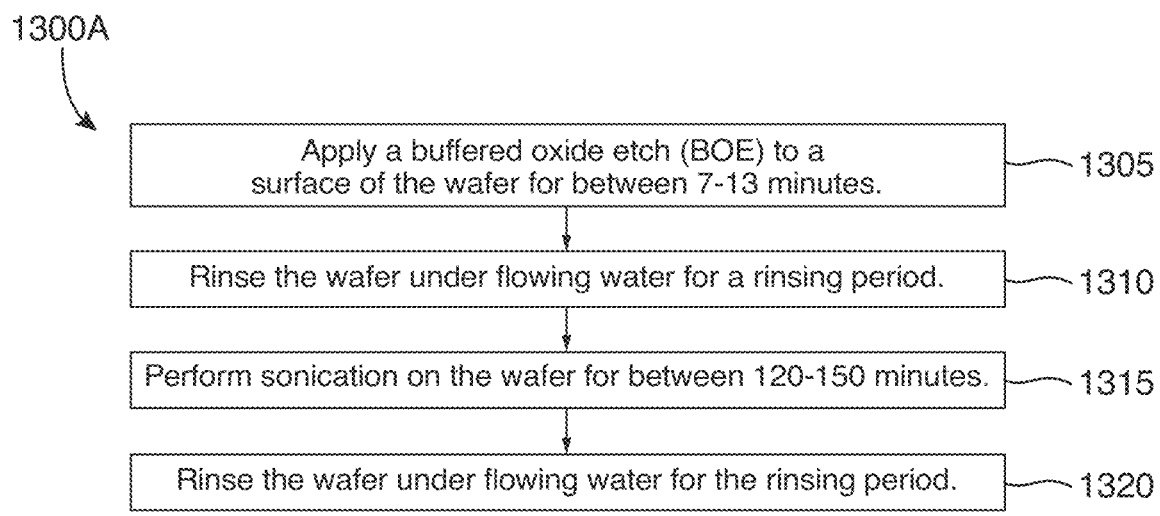
FIG. 13A is a flow chart of a first series of operations for removing LT-AlN and patterned oxide formed between the multiple c-GaN-grown strips according to at least one embodiment.

FIG. 13A is a flow chart of a first series of operations 1300A for removing LT-AlN and patterned oxide formed between the multiple c-GaN-grown strips according to at least one embodiment. The operations 1300A can be performed using standard semiconductor deposition and etching techniques, e.g., in complementary metal-oxide-semiconductor (CMOS) processing technology, as will be explained. In some embodiments, therefore, at least some of the operations 1300A are controlled by a controller or processing device that interacts with CMOS processing equipment.

The operations 1300A may begin with a wafer having multiple U-shaped grooves in which are grown gallium-nitride (GaN)-based structures, the multiple U-shaped grooves including a patterned oxide layer and a buffer layer disposed on the patterned oxide layer. The operations 1300A may designed to perform a wet etch of the wafer to selectively remove the patterned oxide layer 810 and the buffer layer 814 disposed on the patterned oxide layer (see FIG. 14A).

At operation 1305, the processing equipment applies a buffered oxide etch (BOE) to a surface of the wafer for between 7-13 minutes, e.g., 10 minutes in one embodiment.

At operation 1310, the processing equipment rinses the wafer under flowing water for a rinsing period. In some embodiments, the rising period is between 30 seconds and two minutes, e.g., 1 minute in one embodiment.

At operation 1315, the processing equipment performs sonication on the wafer for between 120-150 minutes, e.g., 135 minutes in one embodiment.

At operation 1320, the processing equipment rinses the wafer under flowing water for the rinsing period.

Figure 13B:
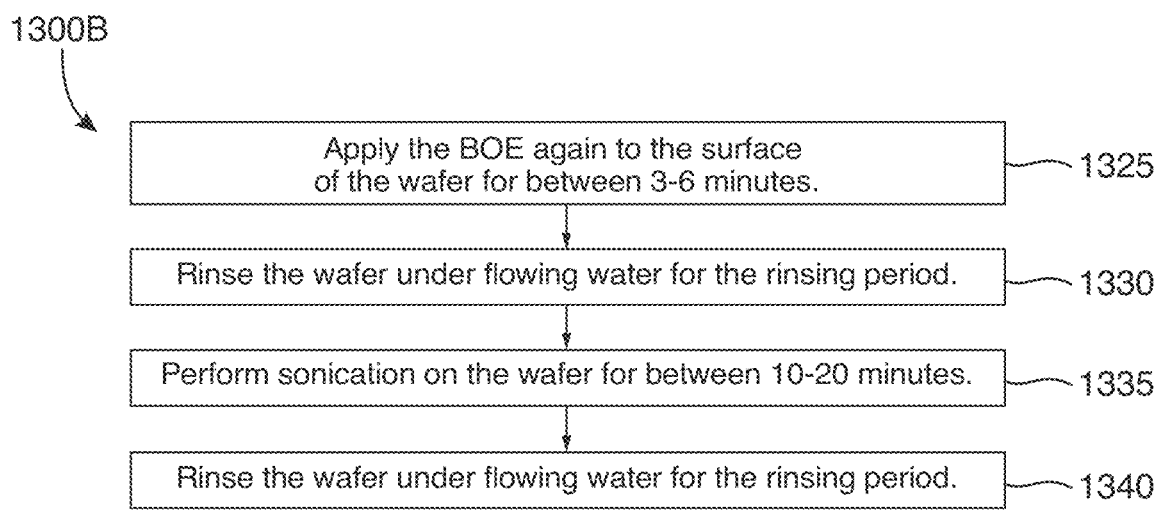
FIG. 13B is a flow chart of a second series of operations for removing LT-AlN and patterned oxide formed between the multiple c-GaN-grown strips according to at least one embodiment.
Figure 13B:
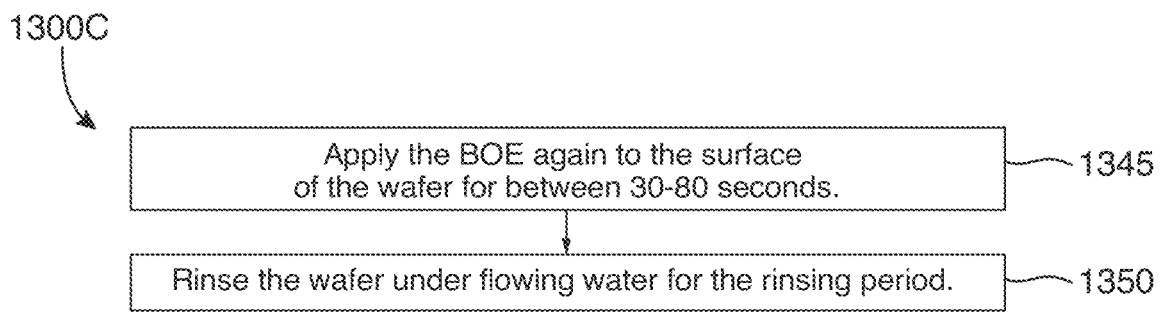

FIG. 13B is a flow chart of a second series of operations 1300B for removing LT-AlN and patterned oxide formed between the multiple c-GaN-grown strips according to at least one embodiment. The operations 1300B can be performed using standard semiconductor deposition and etching techniques, e.g., in complementary metal-oxide-semiconductor (CMOS) processing technology, as will be explained. In some embodiments, therefore, at least some of the operations 1300B are controlled by a controller or processing device that interacts with CMOS processing equipment.

At operation 1325, the processing equipment again applies the BOE to the surface of the wafer for between 3-6 minutes, e.g., five minutes in one embodiment.

At operation 1330, the processing equipment again rinses the wafer under flowing water for the rinsing period.

At operation 1335, the processing equipment again performs sonication on the wafer for between 10-20 minutes, e.g., 15 minutes in one embodiment.

At operation 1340, the processing equipment again rinses the wafer under flowing water for the rinsing period.

FIG. 13C is a flow chart of a third series of operations 1300C for removing LT-AlN and patterned oxide formed between the multiple c-GaN-grown strips according to at least one embodiment. The operations 1300C can be performed using standard semiconductor deposition and etching techniques, e.g., in complementary metal-oxide-semiconductor (CMOS) processing technology, as will be explained. In some embodiments, therefore, at least some of the operations 1300C are controlled by a controller or processing device that interacts with CMOS processing equipment.

At operation 1345, the processing equipment again applies the BOE to the surface of the wafer for between 30-80 seconds, e.g., for one minute in one embodiment.

At operation 1350, the processing equipment again rinses the wafer under flowing water for the rinsing period.

Figure 14A:
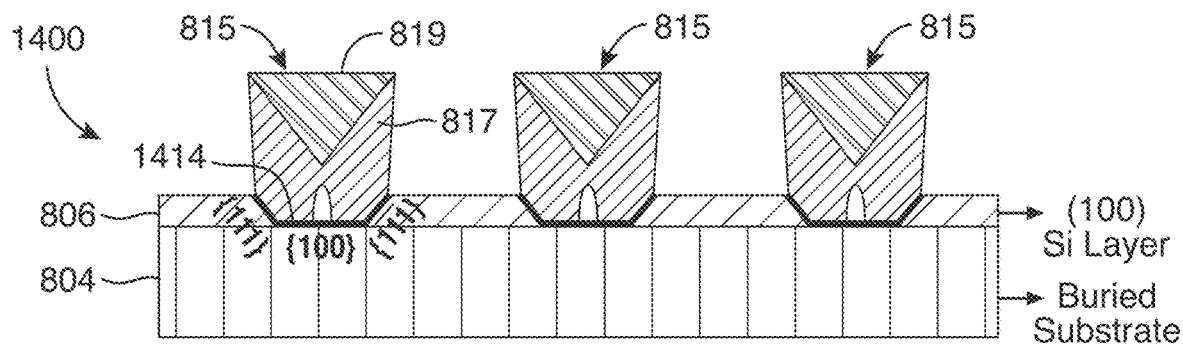
FIG. 14A is a cross-section view of a wafer having several of the c-GaN-grown strips after removal of the LT-AlN and patterned oxide according to FIGS. 13A-13C according to at least one embodiment.

FIG. 14A is a cross-section view of a wafer 1400 having several of the c-GaN-grown strips 815 after removal of the LT-AlN and patterned oxide according to FIGS. 13A-13C according to at least one embodiment. In at least some embodiments, the wafer 1400 includes the buried substrate 804 and the layer of silicon (100) 806 disposed on the buried substrate and forming multiple U-shaped grooves, where each U-shaped groove includes a bottom portion and silicon sidewalls (111) at an angle to the buried substrate 804. In this embodiment, a buffer layer 1414 is disposed within the multiple U-shaped grooves. In at least some embodiment, multiple gallium nitride (GaN)-based structures 815 having vertical sidewalls are disposed within and protrude above the multiple U-shaped grooves. The multiple GaN-based structures 815 each include cubic gallium nitride (c-GaN)

819 formed at merged growth fronts of hexagonal gallium nitride (h-GaN) 817 that extend from the silicon sidewalls (111).

In these embodiment, the patterned oxide 810 and the buffer layer 1414 covering the patterned oxide 810 are etched away as discussed with reference to FIGS. 13A-13C, leaving behind the etched buried substrate 804, layer of silicon (100) 806, and a small portion of LT-AlN (e.g., of the buffer layer 1415) left on top of these other layers. It is within this remainder of the U-shaped groves that the now much taller GaN-based structures 815 are disposed. In some embodiments, a facet density of the c-GaN is between approximately $3-4\times10^4$ per centimeter.

In some embodiments, the buried substrate 804 is one of silicon, a silicon-based oxide, or a dielectric. In at least some embodiments, the vertical sidewalls of the multiple GaN-based structures extend more than twice a height of the U-shaped grooves above the layer of silicon (100) 806.

Figure 14B:
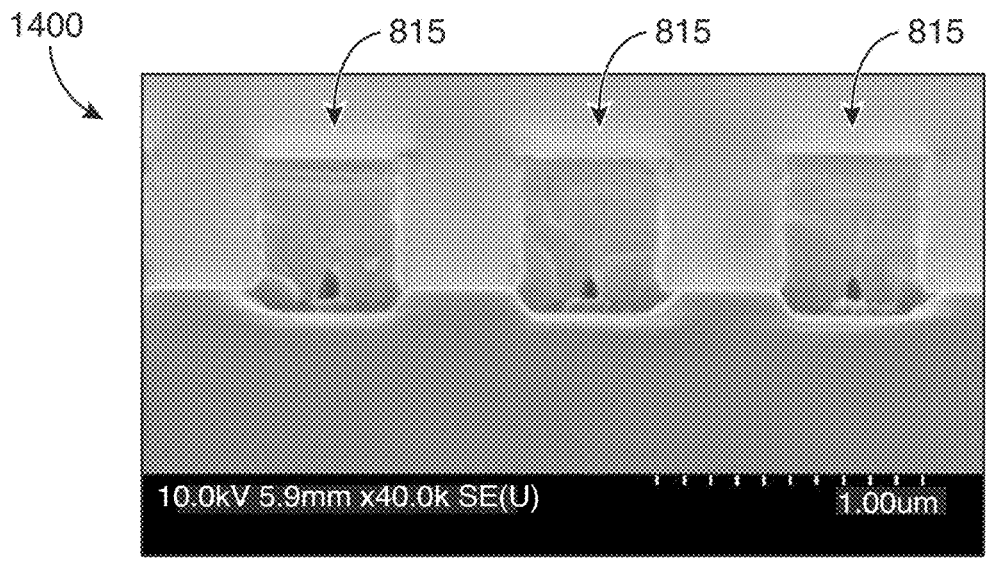
FIG. 14B is an SEM image of a cross-section view of the wafer of FIG. 14A according to at least one embodiment.
Figure 14C:
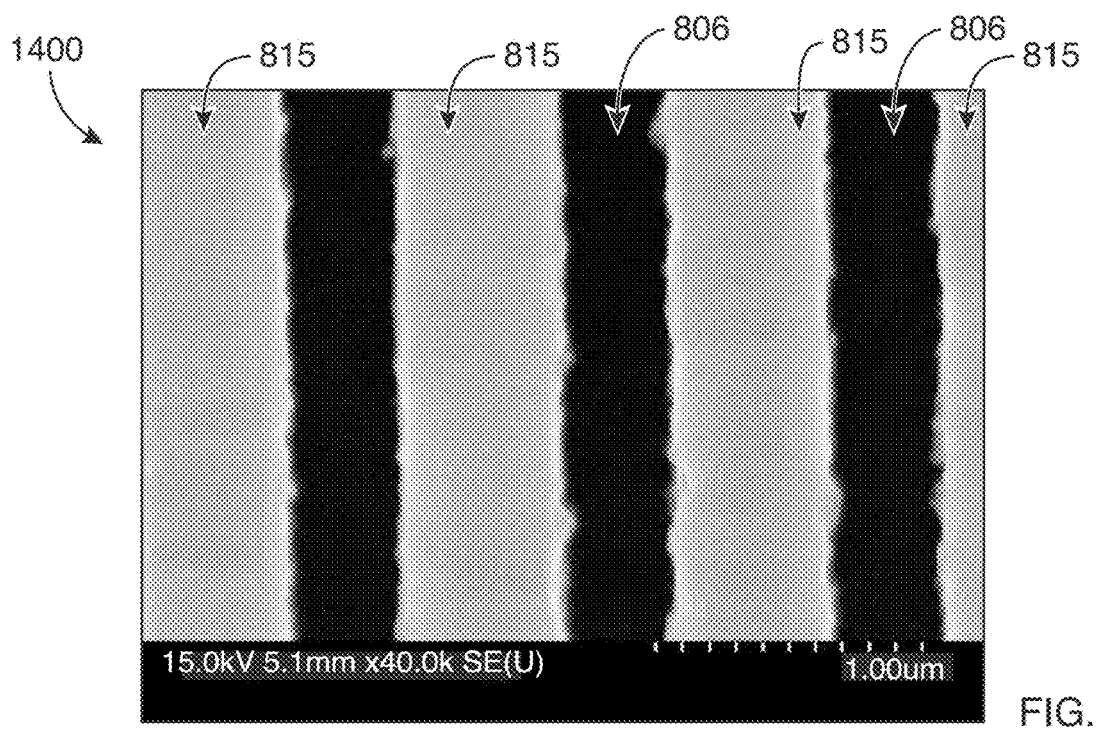
FIG. 14C is an SEM image of a top view of the wafer of FIG. 14A according to at least one embodiment.

FIG. 14B is an SEM image of a cross-section view of the wafer 1400 of FIG. 14A according to at least one embodiment. FIG. 14C is an SEM image of a top view of the wafer 1400 of FIG. 14A according to at least one embodiment. In FIGS. 14B-14C, the GaN-based structures 815 are strips with the layer of silicon (100) 806 illustrated as being exposed, via etching, between the GaN-based structures 815.

Figure 15A:
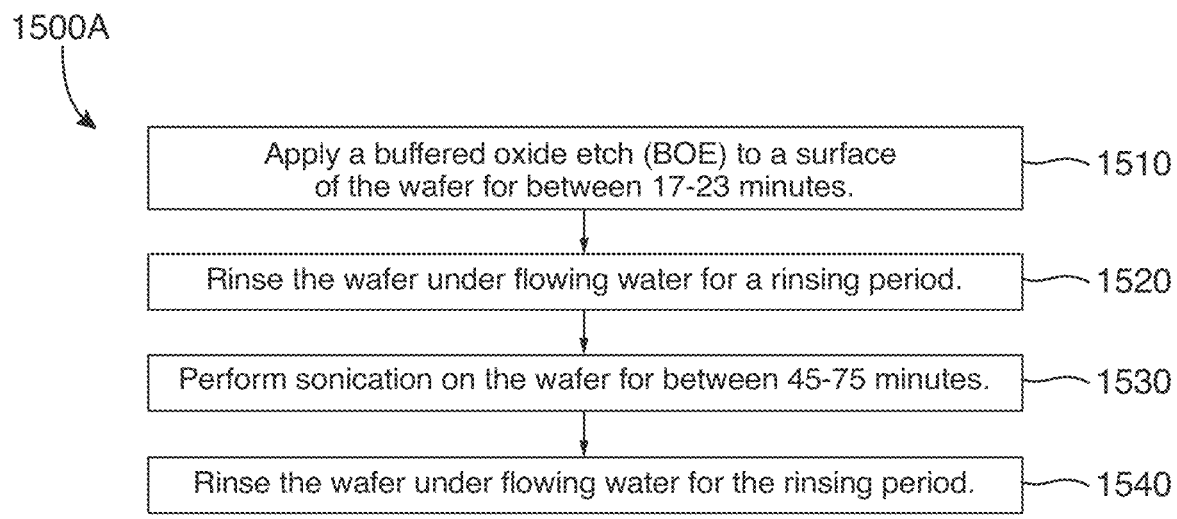
FIG. 15A is a first set of operations for removing LT-AlN, patterned oxide, and h-GaN from the c-GaN-grown strip layers according to at least one embodiment.

FIG. 15A is a first set of operations 1500A for removing LT-AlN, patterned oxide, and h-GaN from the c-GaN-grown strip layers according to at least one embodiment. The operations 1500A can be performed using standard semiconductor deposition and etching techniques, e.g., in complementary metal-oxide-semiconductor (CMOS) processing technology, as will be explained. In some embodiments, therefore, at least some of the operations 1500A are controlled by a controller or processing device that interacts with CMOS processing equipment.

The operations 1500A may begin with a wafer having multiple U-shaped grooves in which are grown gallium-nitride (GaN)-based structures, the multiple U-shaped grooves including the patterned oxide layer 810 and the buffer layer 814 disposed on the patterned oxide layer. In these embodiments, each GaN-based structure includes cubic GaN (c-GaN) formed at merged growth fronts of hexagonal GaN (h-GaN) that extend from silicon sidewalls (111) of a bottom of each U-shaped groove. The operations 1500A may designed to perform a wet etch of the wafer to selectively remove the patterned oxide layer 810, the buffer layer 814 (e.g., LT-AlN), disposed on the patterned oxide layer, and sidewall portions of the h-GaN (see FIG. 16A). Further, in performing the wet etch to selectively remove the sidewall portions of the h-GaN, the c-GaN is substantially preserved At operation 1510, the processing equipment applies a buffered oxide etch (BOE) to a surface of the wafer for between 17-23 minutes, e.g., 20 minutes in one embodiment.

At operation 1520, the processing equipment rinses the wafer under flowing water for a rinsing period. In some embodiments, the rising period is between 30 seconds and two minutes, e.g., 1 minute in one embodiment.

At operation 1530, the processing equipment performs sonication on the wafer for between 45-75 minutes, e.g., one hour in one embodiment.

At operation 1540, the processing equipment rinses the wafer under flowing water for the rinsing period.

Figure 15B:
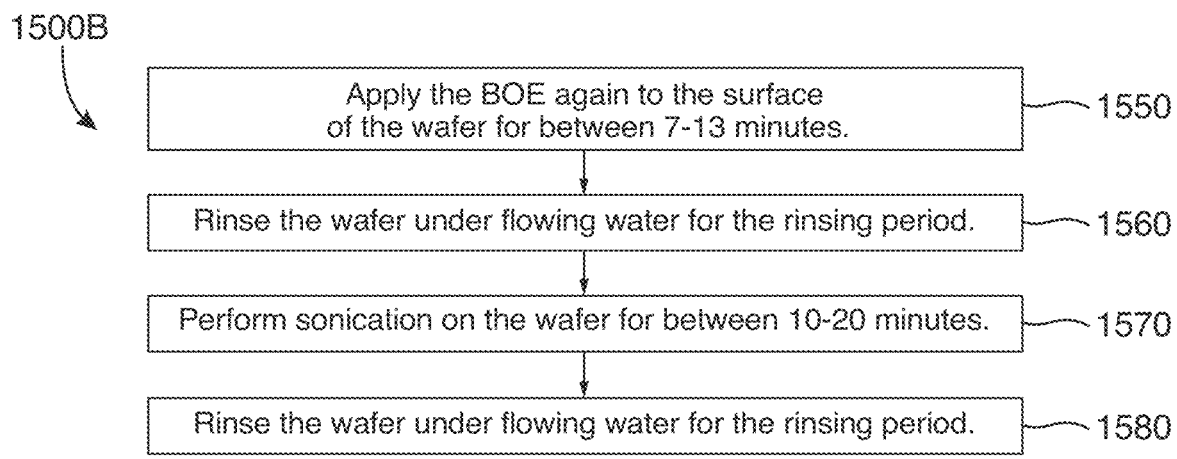
FIG. 15B is a second set of operations for removing LT-AlN, patterned oxide, and h-GaN from the c-GaN-grown strip layers according to at least one embodiment.

FIG. 15B is a second set of operations 1500B for removing LT-AlN, patterned oxide, and h-GaN from the c-GaN-grown strip layers according to at least one embodiment. The operations 1500B can be performed using standard semiconductor deposition and etching techniques, e.g., in complementary metal-oxide-semiconductor (CMOS) processing technology, as will be explained. In some embodiments, therefore, at least some of the operations 1500B are controlled by a controller or processing device that interacts with CMOS processing equipment.

At operation 1550, the processing equipment again applies the BOE to the surface of the wafer for between 7-13 minutes, e.g., 10 minutes in one embodiment.

At operation 1560, the processing equipment again rinses the wafer under flowing water for the rinsing period.

At operation 1570, the processing equipment again performs sonication on the wafer for between 10-20 minutes.

At operation 1580, the processing equipment again rinses the wafer under flowing water for the rinsing period.

Figure 16A:
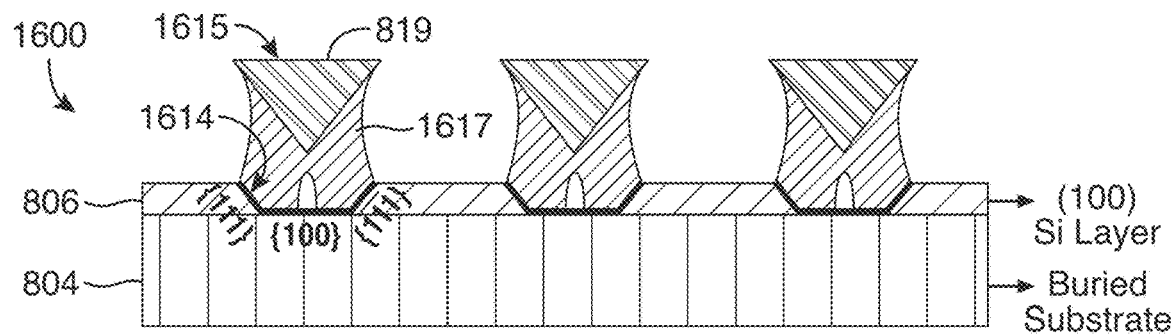
FIG. 16A is a cross-section view of a wafer having several of the c-GaN-grown strips after removal of the LT-AlN, patterned oxide, and h-GaN according to FIGS. 15A-15B according to at least one embodiment.

FIG. 16A is a cross-section view of a wafer 1600 having several of the c-GaN-grown strips after removal of the LT-AlN, patterned oxide, and h-GaN according to FIGS. 15A-15B according to at least one embodiment. a buried substrate. In at least some embodiments, the wafer 1600 includes the buried substrate 804 and the layer of silicon (100) 806 disposed on the buried substrate 804 and forming multiple U-shaped grooves. In these embodiments, each U-shaped groove includes a bottom portion and silicon sidewalls (111) at an angle to the buried substrate 804. In these embodiments, a buffer layer 1614 is disposed on top of the layer of silicon 806 within the multiple U-shaped grooves as well as on the exposed buried substrate 804. In these embodiments, multiple gallium nitride (GaN)-based structures 1615 having vertical sidewalls are disposed within and protruding above the U-shaped grooves.

In at least some embodiments, the multiple GaN-based structures 1615 each include cubic gallium nitride (c-GaN) 819 formed at merged growth fronts of hexagonal gallium nitride (h-GaN) 817 that extend from the silicon sidewalls (111), where at least sidewall portions of the h-GaN 1617 of the multiple GaN-based structures 1615 are wet-etched. Thus, in some embodiments, the sidewalls of the h-GaN of each GaN-based structure is curved from being wet-etched. Also, in some embodiments, the vertical sidewalls of the multiple GaN-based structures 1615 extend more than twice a height of the U-shaped grooves above the layer of silicon. In some embodiments, a facet density of the c-GaN is between approximately $3-4\times10^4$ per centimeter.

Figure 16B:
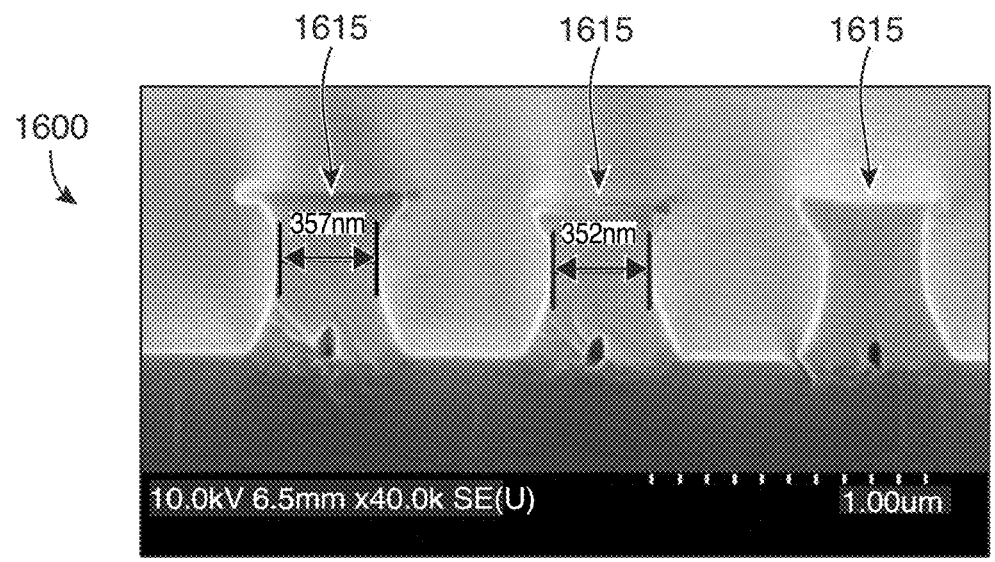
FIG. 16B is an SEM image of a cross-section view of the wafer of FIG. 16A according to at least one embodiment.
Figure 16C:
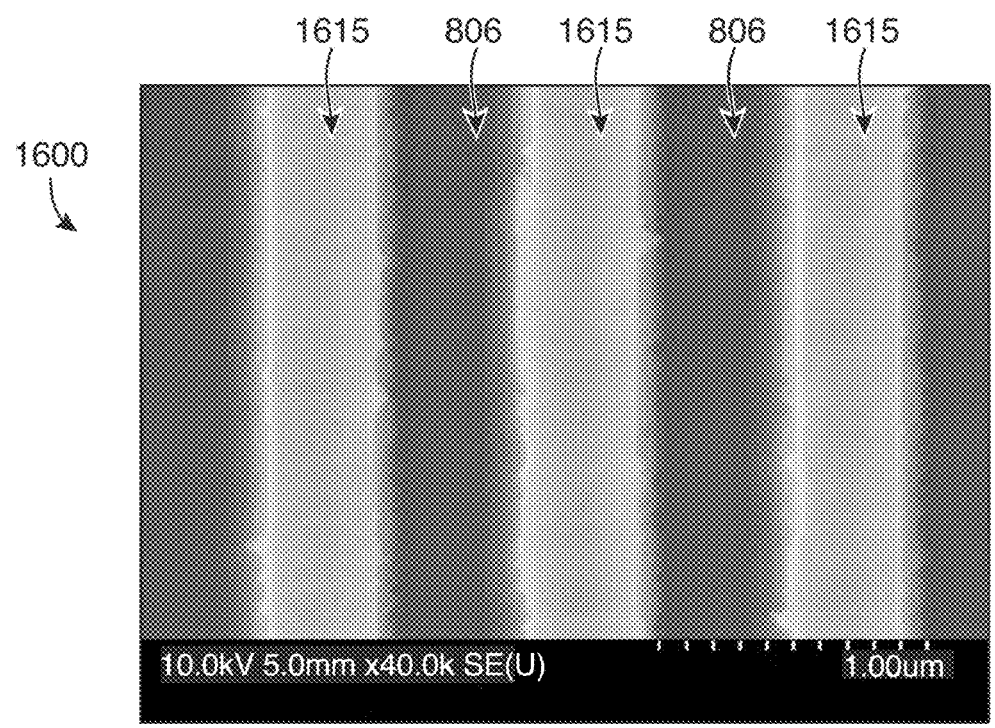
FIG. 16C is an SEM image of a top view of the wafer of FIG. 16A according to at least one embodiment.

FIG. 16B is an SEM image of a cross-section view of the wafer of FIG. 16A according to at least one embodiment. FIG. 16C is an SEM image of a top view of the wafer of FIG. 16A according to at least one embodiment. In FIGS. 14B-14C, the GaN-based structures 1615 are strips with the layer of silicon (100) 806 illustrated as being exposed, via etching, between the GaN-based structures 1615. Further, the vertical sidewalls of the h-GaN are no longer vertical, having been wet etched, and thus become at least partially concaved.

Normally, due to a wide bandgap and more covalent bonds, gallium nitride (GaN) does not have a wet etchant that is capable of performing wet etching on the GaN. In the disclosed embodiments, however, due to the CMOS-caused oxidation of the h-GaN surface areas, the h-GaN has its conductivity changed (e.g., increased resistivity by around 18-22% or more) and is made wet-etchable while the c-GaN layers (or c-GaN strips) are substantially preserved during the wet etching. As discussed with reference to operation 550 of method 500 (FIG. 5), the h-GaN layers can be made or become wet-etchable by controlling the increasing of the temperature of the MOCVD reactor (at operation 525)

during the GaN epitaxial growth such that the h-GaN is oxidized by the oxide layer 410, making the h-GaN wet-etchable.

While other wet etchants are envisioned, BOE is the wet etchant used in the disclosed prototypes of GaN-based structures discussed herein. The advantages of performing such wet etching to remove at least a portion of the h-GaN sidewalls of these GaN-based structures include removing parasitic growth from the LT-AlN buffer layers and ensuring that the sidewalls of the U-shaped grooves are cleaned of such parasitic growth.

TABLE 1

| Sample Details | IQE |
| --- | --- |
| Previous World Record Approach, ACS Photonics, 5(3), 955-963 (2018). | 29% |
| As-grown (FIG. 8A) | 26% |
| Buffer Layer Removed (FIG. 12A) | 24% |
| Buffer Layer, Oxide Layer Removed (FIG. 14A) | 24% |
| Buffer Layer, Oxide Layer, and h-GaN Removed (FIG. 16A) | 32% |

Table 1 lists values of Internal Quantum Efficiency (IQE) for the GaN-based structures depending on method of manufacturing as discussed here, compared with Applicant's approach. While all approaches beat the previous world record approach, the sample that also includes removal of some of the h-GaN vertical sidewalls has a marked improvement in IQE due to removal of parasitic growth just discussed.

Internal quantum efficiency (IQE) ($\eta_i$) is defined as the ratio of the number of electron-hole (e-h) pairs or charge carriers generated to the number of photons absorbed, within the active layer(s) of the device. It is also called the quantum yield and accounts for the recombination loss. Typically, for a superior quality material with low dislocation density and defects, IQE could be close to 100% if absorption due to free carriers is negligible.

Figure 17A:
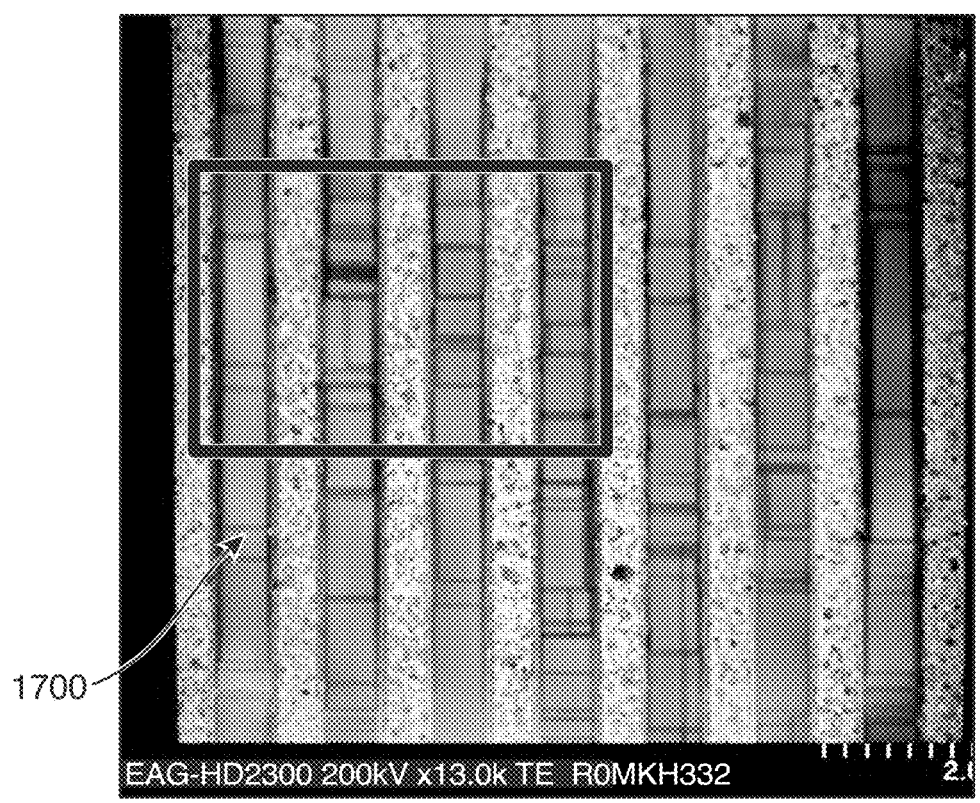
FIG. 17A is a plan-view TEM image of a top view of multiple c-GaN-grown strips as discussed herein illustrating that the c-GaN-grown strips are substantially free of threading dislocations and that has stacking faults with a density of $3.60+/-0.4\times10^8$ cm$^{-2}$, according to various embodiments.
Figure 17B:
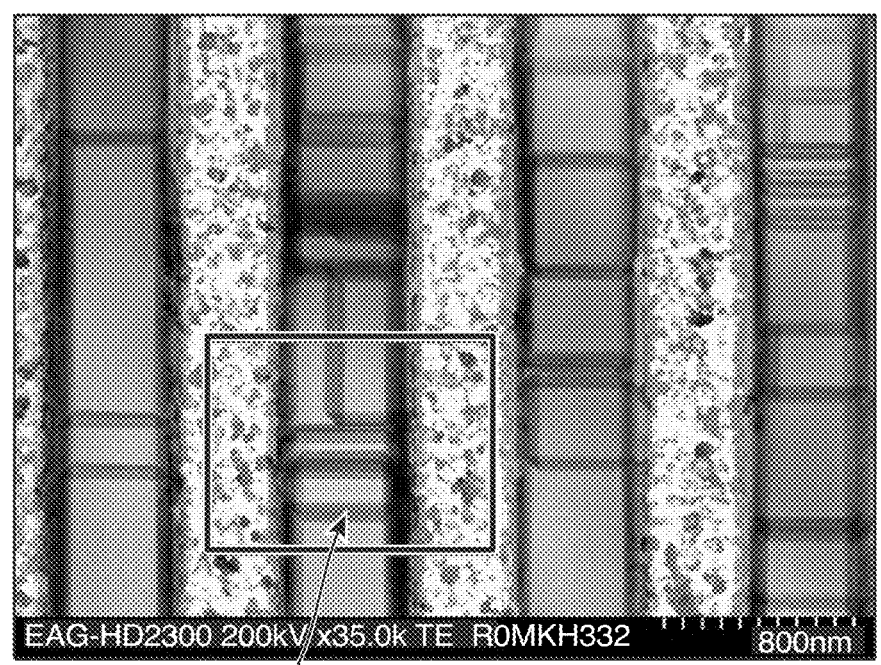
FIG. 17B is a plan-view TEM image of a zoom-in, boxed portion of the top view of FIG. 17A according to at least one embodiment.
Figure 17C:
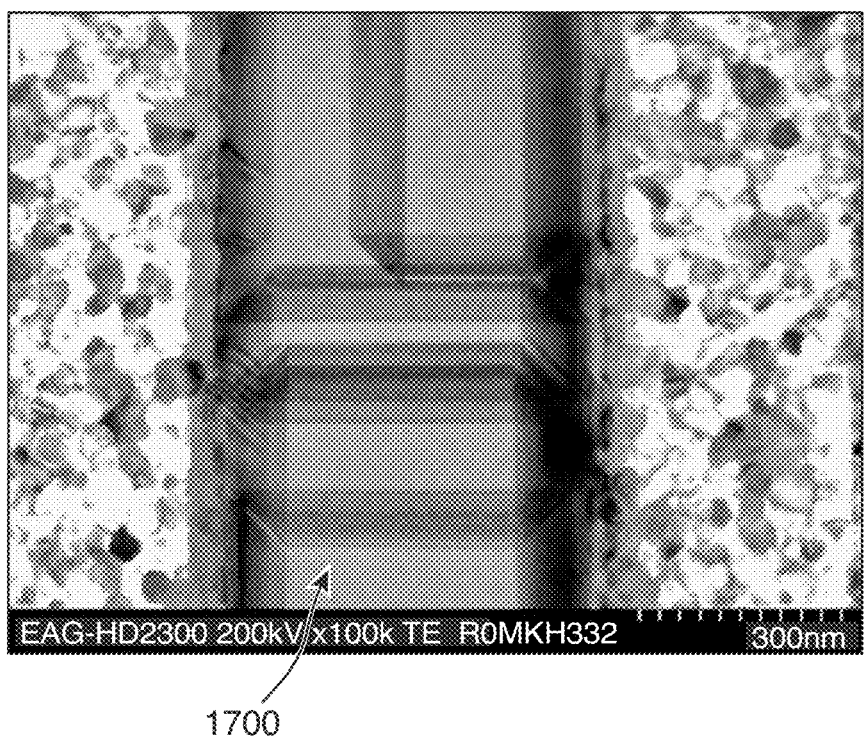
FIG. 17C is a plan-view TEM image of a zoomed-in, boxed portion of the top view of FIG. 17B according to at least one embodiment.

FIG. 17A is a plan-view TEM image of a top view of multiple c-GaN-grown strips as discussed herein illustrating that the c-GaN-grown strips are substantially free of threading dislocations and that has stacking faults with a density of approximately $3.3+/-0.2\times10^4$ per cm, according to various embodiments. FIG. 17B is a plan-view TEM image of a zoom-in, boxed portion of the top view of FIG. 17A according to at least one embodiment. FIG. 17C is a plan-view TEM image of a zoomed-in, boxed portion of the top view of FIG. 17B according to at least one embodiment.

Samples were sent to a EAG Laboratories, a metallurgy company that measures defect densities in various materials. The results of measurement was that there were no detectable threading or other dislocations in the c-GaN-grown strips. The company only found vertical stacking faults that are that have a density of approximately $3.4+/-0.2\times10^4$ per cm, which is the lowest ever reported in cubic GaN materials. Stacking faults occur when a portion of material have atoms that are inconsistently stacked with reference to the rest (or another portion) of the material. As can be observed in FIGS. 17A-17C, the vertically-aligned stacking faults are generally parallel to each other. The stacking faults appear as grooves on or near the top surface, and go down a layer or two but generally not very far below the surface.

Figure 18:
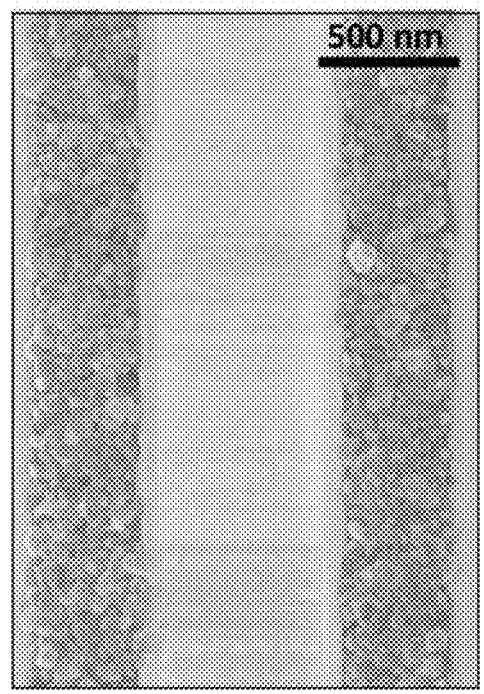
FIG. 18 is a SEM image of a zoomed-in portion of a c-GaN-grown strip illustrated more particularly and that has a facet density that is between approximately between $3$-$4\times10^4$ per centimeter (cm) according to at least one embodiment.

FIG. 18 is a SEM image of a zoomed-in portion of a c-GaN-grown strip illustrated more particularly and that has a facet density that is between approximately between $3-4\times10^4$ per cm according to at least one embodiment. In disclosed embodiments, the facet density refers to a density of atomic-layer transitions within the same material, here specifically the c-GaN layer of strips. For context, a measurement of 500 nm is illustrated on top of the plan-view TEM image.

Figure 19:
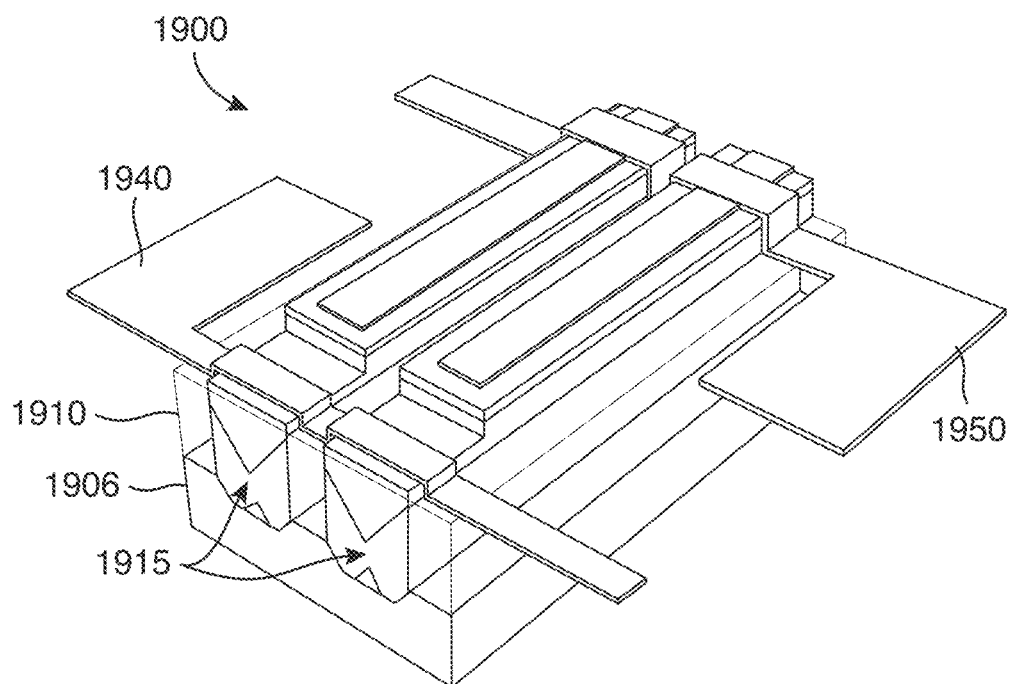
FIG. 19 is a perspective view of an LED stack formed from multiple GaN-based structures formed as discussed herein according to at least one embodiment.

FIG. 19 is a perspective view of an LED stack 1900 formed from multiple GaN-based structures 1915 formed as discussed herein according to at least one embodiment. For example, the GaN-based structures can be any of the GaN-based structures discussed with reference to the above Figures that discussed the growth of c-GaN at the intersection of two h-GaN fronts that are epitaxially grown. In at least some embodiments, the LED stack 1900 includes a silicon layer 1906 (e.g., silicon (100)), a patterned oxide 1910 (such as SiO$_2$, for example) disposed on the silicon layer 1906, the multiple GaN-based structures 1915 disposed within the patterned oxide 1910, an n-type contact 1940 disposed over first ends of the multiple GaN-based structures 1915, and a p-type contact 1950 disposed over second ends of the multiple GaN-based structures 1920, to thereby send current down the length of the multiple GaN-based structures.

Figure 20:
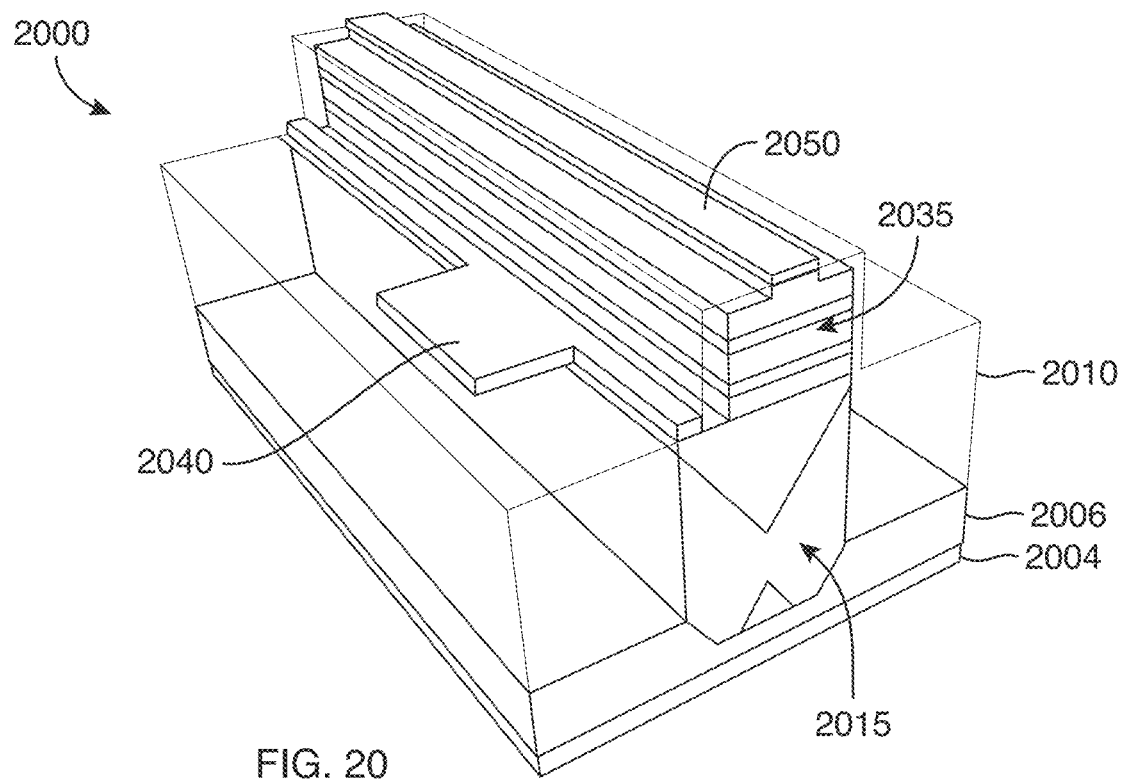
FIG. 20 is a laser diode formed from at least one GaN-based structure formed as discussed herein according to at least one embodiment.

FIG. 20 is a laser diode 2000 formed from at least one GaN-based structure 2015 formed as discussed herein according to at least one embodiment. In at least some embodiments, the laser diode 2000 includes a buried substrate 2004, a silicon layer 2006 disposed on the buried substrate 2004, and the at least one GaN-based structure 2015 disposed on the silicon layer 2006 (and potentially also disposed on the buried substrate 2004 as described herein). The laser diode 2000 can further include one or more guiding layers 2035 disposed on a portion of the c-GaN strip of the at least one GaN-based structure 2015 and an n-type contact 2040 also disposed on the c-GaN strip and spaced from the one or more guiding layers 2035. The laser diode 2000 can further include a p-type contact 2050 disposed on the one or more guiding layers 2035, to generate current with the n-type contact 2040 through the c-GaN strip of the at least one GaN-based structure 2015.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents, now presented or presented in a subsequent application claiming priority to this application.

What is claimed is:

1. A wafer comprising:
a buried substrate;
a first layer of silicon (100) disposed on the buried substrate that includes silicon sidewalls (111) at an angle to the buried substrate and that form a bottom of each of multiple U-shaped grooves;
a second layer of patterned oxide disposed on the silicon (100) that provides vertical sidewalls of each U-shaped groove formed within the first and second layers;
a third layer of a buffer covering the silicon sidewalls (111) of the first layer and the buried substrate within the U-shaped grooves, wherein the third layer further covers the second layer at least partway up the vertical sidewalls; and multiple gallium nitride (GaN)-based structures disposed within the multiple U-shaped grooves, wherein each of the multiple GaN-based structures includes cubic gallium nitride (c-GaN) formed at merged growth fronts of hexagonal gallium nitride (h-GaN) that extend from the silicon sidewalls (111).

2. The wafer of claim 1, wherein the buried substrate comprises one of silicon, a silicon-based oxide, a dielectric, a silicon on insulator, or a combination thereof.

3. The wafer of claim 1, wherein the patterned oxide comprises one of silicon dioxide, silicon nitride oxide, or a combination thereof.

4. The wafer of claim 1, wherein an upper layer of the c-GaN:
is parallel to the first layer;
is substantially free of threading dislocations; and
comprises one or more stacking faults.

5. The wafer of claim 1, wherein a facet density of the c-GaN is between approximately $3\text{-}4\times10^4$ per centimeter.

6. The wafer of claim 1, wherein the buffer comprises one of aluminum nitride, and aluminum silicide, or a combination thereof.

7. A wafer comprising:
a buried substrate;
a first layer of silicon (100) disposed on the buried substrate that includes silicon sidewalls (111) at an angle to the buried substrate and that form a bottom of each of multiple U-shaped grooves;
a second layer of patterned oxide disposed on the silicon (100) that provides vertical sidewalls of each U-shaped groove formed within the first and second layers;

a third layer of a buffer covering the silicon sidewalls (111) of the first layer and the buried substrate within the U-shaped grooves, wherein the third layer further covers the second layer at least partway up the vertical sidewalls; and multiple Group-III nitride-based structures disposed within the multiple U-shaped grooves, wherein each of the multiple Group-III nitride-based structures includes a cubic Group-III nitride formed at merged growth fronts of hexagonal Group-III nitride that extend from the silicon sidewalls (111).

8. The wafer of claim 7, wherein the multiple Group-III nitride-based structures are comprised of gallium nitride (GaN).

9. The wafer of claim 7, wherein the buried substrate comprises one of silicon, a silicon-based oxide, a dielectric, a silicon on insulator, or a combination thereof.

10. The wafer of claim 7, wherein the patterned oxide comprises one of silicon dioxide, silicon nitride oxide, or a combination thereof.

11. The wafer of claim 7, wherein the buffer comprises one of aluminum nitride, aluminum silicide, or a combination thereof.

12. The wafer of claim 7, wherein an upper layer of the cubic Group-III nitride:
is parallel to the first layer;
is substantially free of threading dislocations; and
comprises one or more stacking faults.

13. The wafer of claim 7, wherein a facet density of the cubic Group-III nitride is between approximately $3\text{-}4\times10^4$ per centimeter.

* * * * *